(12) United States Patent
Johnson et al.

(10) Patent No.: US 9,447,992 B2
(45) Date of Patent: Sep. 20, 2016

(54) GEOTHERMAL SYSTEM WITH EARTH GROUNDING COMPONENT

(71) Applicant: Futurewei Technologies, Inc., Plano, TX (US)

(72) Inventors: Kelly Johnson, Dallas, TX (US); Pedro Fernandez, Dallas, TX (US)

(73) Assignee: Futurewei Technologies, Inc., Plano, TX (US)

(*) Notice: Subject to any disclaimer, the term of this patent is extended or adjusted under 35 U.S.C. 154(b) by 826 days.

(21) Appl. No.: 13/674,545

(22) Filed: Nov. 12, 2012

(65) Prior Publication Data

US 2013/0075057 A1   Mar. 28, 2013

Related U.S. Application Data

(63) Continuation-in-part of application No. 13/184,948, filed on Jul. 18, 2011, now Pat. No. 9,241,426.

(60) Provisional application No. 61/409,810, filed on Nov. 3, 2010.

(51) Int. Cl.
  *F24J 3/08*  (2006.01)
  *H02G 9/00*  (2006.01)
  *H05K 7/20*  (2006.01)

(52) U.S. Cl.
  CPC *F24J 3/08* (2013.01); *F24J 3/081* (2013.01); *F24J 3/083* (2013.01); *F24J 3/084* (2013.01);
  (Continued)

(58) Field of Classification Search
  CPC .............. F24J 3/08; F24J 3/081; F24J 3/083; F24J 3/084; F24J 2003/087; F28D 2021/0035; F28D 7/106; F28D 1/05391; F28D 9/26; F28D 9/0219; H02G 9/00; H05K 7/2059; B60H 1/18; Y02E 10/12; Y02E 10/125; Y02E 60/142
  USPC .................................................. 174/15.1, 6
  See application file for complete search history.

(56) References Cited

U.S. PATENT DOCUMENTS

| 2,658,729 A | 11/1953 | Horwitz |
| 3,777,502 A | 12/1973 | Michie, III et al. |

(Continued)

FOREIGN PATENT DOCUMENTS

| CN | 1947481 A | 7/2005 |
| CN | 101131045 A | 7/2008 |

(Continued)

OTHER PUBLICATIONS

Conroy et al. "Deep Earth Grounding vs Shallow Earth Grounding," Computer Power & Consulting, http://www.cpccorp.com/deep.htm, 1993, 13 pages.

(Continued)

*Primary Examiner* — Jenny L Wagner
*Assistant Examiner* — Ahmad D Barnes
(74) *Attorney, Agent, or Firm* — Futurewei Technologies, Inc.

(57) ABSTRACT

A geothermal system with earth grounding component for providing electrical grounding is introduced. The geothermal system includes: a geothermal component configured to perform heat exchange; wherein the geothermal component comprises at least one heat exchange tube configured to extend into an underground environment; and an earth grounding component configured to provide earth grounding for electronic equipment; wherein the earth grounding component includes at least one conductive rod coupled to and extended along the at least one heat exchange tube, and the at least one conductive rod is configured to electrically couple to a grounding interface of the electronic equipment.

16 Claims, 30 Drawing Sheets

(52) U.S. Cl.
CPC .............. *H02G 9/00* (2013.01); *H05K 7/2059* (2013.01); *F24J 2003/087* (2013.01); *Y02E 10/12* (2013.01); *Y02E 10/125* (2013.01)

(56) References Cited

U.S. PATENT DOCUMENTS

| | | | |
|---|---|---|---|
| 4,234,037 | A | 11/1980 | Rogers et al. |
| 4,325,228 | A | 4/1982 | Wolf |
| 4,369,635 | A | 1/1983 | Lambert |
| 4,441,067 | A | 4/1984 | O'Hare |
| 4,448,238 | A | 5/1984 | Singleton, Jr. et al. |
| 4,574,875 | A | 3/1986 | Rawlings et al. |
| 4,674,561 | A | 6/1987 | Kelley |
| 4,852,054 | A | 7/1989 | Mastandrea |
| 5,099,652 | A | 3/1992 | Lida |
| 5,216,577 | A | 6/1993 | Schilling |
| 5,339,890 | A | 8/1994 | Rawlings |
| 5,758,514 | A | 6/1998 | Genung |
| 6,523,602 | B2 | 2/2003 | Holighaus et al. |
| 6,640,575 | B2 | 11/2003 | Word |
| 6,691,766 | B1 | 2/2004 | Azar |
| 6,810,945 | B1 | 11/2004 | Boissevain |
| 7,571,762 | B2 | 8/2009 | Ross |
| 7,621,129 | B2 | 11/2009 | DuBois |
| 7,961,463 | B2 | 6/2011 | Belady et al. |
| 2002/0088604 | A1 | 7/2002 | Holighaus et al. |
| 2004/0257766 | A1 | 12/2004 | Rasmussen et al. |
| 2005/0153649 | A1 | 7/2005 | Bettridge et al. |
| 2006/0161311 | A1 | 7/2006 | Vinson et al. |
| 2006/0201179 | A1 | 9/2006 | Kidwell et al. |
| 2007/0289727 | A1 | 12/2007 | Auchter et al. |
| 2008/0053130 | A1 | 3/2008 | Mueller et al. |
| 2009/0029640 | A1 | 1/2009 | Densham |
| 2009/0214299 | A1 | 8/2009 | Roussy |
| 2009/0277602 | A1 | 11/2009 | Yang |
| 2010/0025008 | A1 | 2/2010 | Walford |
| 2010/0041327 | A1 | 2/2010 | Desler |
| 2010/0181044 | A1 | 7/2010 | Juris |
| 2010/0200210 | A1 | 8/2010 | Gian |
| 2010/0226090 | A1 | 9/2010 | Gilliland et al. |
| 2010/0263897 | A1 * | 10/2010 | Nolletti ............................ 174/2 |
| 2010/0295429 | A1 | 11/2010 | Wu et al. |
| 2012/0003558 | A1 | 1/2012 | Devoe et al. |
| 2012/0103558 | A1 | 5/2012 | Fernandez et al. |
| 2012/0103559 | A1 | 5/2012 | Fernandez et al. |
| 2012/0103560 | A1 | 5/2012 | Fernandez et al. |

FOREIGN PATENT DOCUMENTS

| | | |
|---|---|---|
| CN | 101232796 A | 7/2008 |
| CN | 101588704 A | 11/2009 |
| CN | 101588705 A1 | 11/2010 |
| EP | 2136157 A2 * | 12/2009 |
| GB | 2464354 A | 4/2010 |
| WO | 0062590 A1 | 10/2000 |
| WO | 2009140875 A1 | 11/2009 |
| WO | 2010054786 A1 | 5/2010 |

OTHER PUBLICATIONS

Carl Pedersen, Energy Educator: "Ground-source Heat Pumps"; NDSU Extension Service; Aug. 2010; total 8 pages.

* cited by examiner

GEOTHERMAL SYSTEM WITH EARTH GROUNDING COMPONENT

CROSS-REFERENCE TO RELATED APPLICATIONS

The present application is a continuation-in-part application of U.S. application Ser. No. 13/184,948 filed on Jul. 18, 2011 which claims the benefit of U.S. Provisional Application No. 61/409,810, filed Nov. 3, 2010 by Pedro Fernandez et al., both of which are incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Energy-saving strategies are one of the priorities of telecom operators and governments. In particular, cooling technologies have a heavy impact on the total electrical energy consumption for telecom equipment, and needs to be optimized in order to increase overall performance, reduce both capital expenditure (CAPEX)/operational expenditure (OPEX), and reduce the environmental impact.

Electronic equipment generally has strict requirements for the operation environment temperature. If electronic equipment emits heat while operating, and the emitted heat gathers in the surrounding environment of the equipment, the operation environment temperature of the electronic equipment rises. When the operation environment temperature rises past a certain threshold, the electronic equipment may not work properly. Therefore, a refrigeration mechanism, air conditioner or other cooling apparatus are often provided for the electronic equipment. Similarly, if the environmental temperature is too low, the operation of the electronic equipment would be affected. Therefore, electronic equipment located in a low temperature environment may need to be heated.

For medium and low power outdoor equipment, a natural cooling solution may be implemented. In order to enhance the cooling ability of an outdoor cabinet and to reduce the power consumption level of outdoor equipment, a heat insulation layer and/or a sun shielding cover at the top of existing outdoor equipment may be implemented. Further, a wrinkled-wall structure of the outdoor cabinet may be adopted to effectively increase the heat dissipating area and thus enhance the natural heat exchanging ability of the outdoor cabinet. Air heated by power consuming equipment is often circulated inside the cabinet and heat is exchanged with the outside environment via the walls of the cabinet to maintain the normal operation temperature of equipment arranged inside the cabinet.

It is also very important to configure a grounding system for electronic equipment, because an efficient grounding system can protect the electronic equipment from voltage spikes caused by abnormal power sources, such as lightning. Low resistance provided by the grounding system is essential for the protection. However, a relatively higher cost for achieving low resistance grounding in conventional approaches is a concern.

As electronic equipment is designed with increasingly powerful functions and with increased amounts of electronic components, the need to improve the cooling ability of electronic equipment (e.g., under the premise of being environmentally friendly and energy-saving) and provide an efficient grounding system with lower cost increases.

SUMMARY

In one embodiment, the disclosure includes a geothermal system for providing electrical grounding. The geothermal system includes: a geothermal component configured to perform heat exchange; wherein the geothermal component comprises at least one heat exchange tube configured to extend into an underground environment; and an earth grounding component configured to provide earth grounding for electronic equipment; wherein the earth grounding component includes at least one conductive rod coupled to and extended along the at least one heat exchange tube, and the at least one conductive rod is configured to electrically couple to a grounding interface of the electronic equipment.

In one embodiment, the disclosure includes an earth grounding apparatus for providing electrical grounding. The apparatus includes: at least one conductive rod, configured to extend along an element placed in an underground environment, and electrically couple to a grounding interface of electronic equipment; and at least one clamp, configured to hold around the element, and mechanically or molecularly bonded to the at least one conductive rod.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 1A-2 shows a partial view of an earth grounding component in accordance with an embodiment of the disclosure.

FIG. 1A-3 shows a geothermal system in accordance with another embodiment of the disclosure.

FIG. 1A-4 shows an isometric view of the earth grounding component on the geothermal system of FIG. 1A-3.

FIG. 1A-5 shows a geothermal system in accordance with yet another embodiment of the disclosure.

DETAILED DESCRIPTION

It should be understood at the outset that although an illustrative implementation of one or more embodiments are provided below, the disclosed systems and/or methods may be implemented using any quantity of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The disclosed air-based geothermal system takes advantage of the underground temperature relative to the above-ground temperature (e.g., the underground temperature is colder than the above-ground temperature in summer and is hotter than the above-ground temperature in winter) to provide an independent and integrated heat exchange system for electrical equipment. The air-based geothermal system may be a geothermal cooling system and/or a geothermal heating system. The disclosed air-based geothermal system may be implemented for various temperature regulation scenarios including but not limited to a room, an equipment closure or a semi-closed space etc. One embodiment disclosed herein is electronic equipment closure (e.g. not limited to a telecom utility closure) arranged with air-based geothermal cooling. Closure here may be defined as a cabinet, shelter, hut, CEV (Controlled Environment Vault), or other environmentally protective enclosure system to protect electronic equipment. In operation, the thermal load generated by electronic equipment within a telecom utility closure is dissipated by circulating air within the telecom utility closure through an air-based geothermal system installed underground. More specifically, for cooling usage, hot air that is generated by equipment within a telecom utility closure flows through an air-based geothermal system and then returns to the telecom utility closure with a reduced temperature. The disclosed techniques allow for substantial reductions in the operational costs, maintenance costs, and the environmental footprint of cooling or heating telecom utility closures.

Figures 1, 1A:
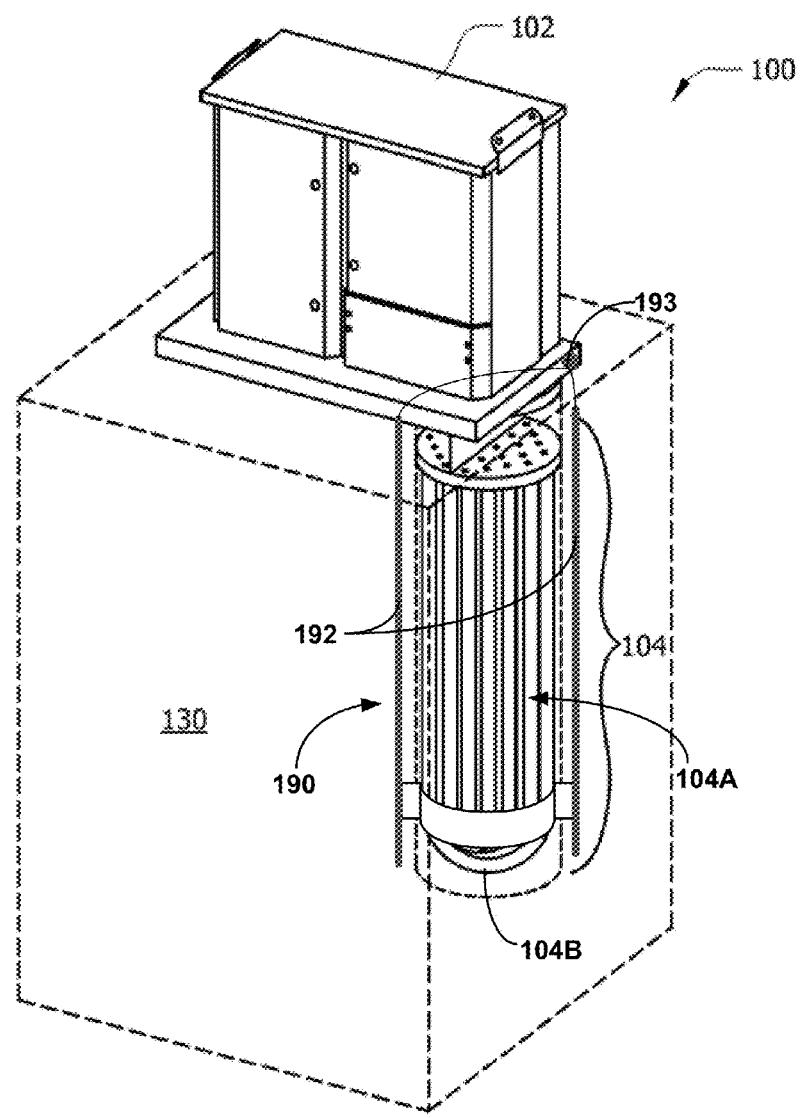
FIG. 1A-1 shows a system in accordance with an embodiment of the disclosure.

FIG. 1A-1 shows a system 100 in accordance with an embodiment of the disclosure. As shown in FIG. 1A-1, the system 100 comprises a telecom utility closure 102 and a geothermal system 104 for the telecom utility closure 102. The geothermal system 104 can be installed, for example, in soil 130 separate from the telecom utility closure 102. After the geothermal system 104 is installed, the telecom utility closure 102 is aligned with the geothermal system 104 such that heat exchange between the telecom utility closure 102 and the geothermal system 104 is possible.

The geothermal system 104 may include a geothermal component 104A configured to perform heat exchange for the telecom utility closure 102. The geothermal component 104A may include at least one heat exchange tube 104B configured to extend into an underground environment.

The system 100 may further comprise an earth grounding component 190. The earth grounding component 190 is used for providing earth grounding for electronic equipment in the telecom utility closure 102. The earth grounding component 190 may include at least one conductive rod 192 coupled to and extended along the at least one heat exchange tube 104B of the geothermal system 104. The at least one conductive rod 192 is configured to electrically couple to a grounding interface 193 for electronic equipment in the telecom utility closure 102. The electronic equipment in the telecom utility closure 102 can be electrically coupled to the earth grounding component 190 through the grounding interface 193. After the geothermal system 104 is installed in a hole underground and buried by soil or backfill material with low resistance and/or high heat conduction rate, the earth grounding component 190 of geothermal system 104 may provide sufficiently low resistance through coupling to the deep earth soil. The deeper a ground rod achieves underground, the lower resistance on the ground rod can be achieved. However, it may cost a lot to dig a deep hole just for grounding. When implementing the embodiment of the disclosure, there is no need to dig an extra hole and install ground rod for grounding the telecom utility closure 102, thus reducing the overall construction cost. Moreover, in areas with frozen soil, the heat generated by the geothermal component 104 may decrease the resistance of its surrounding frozen soil, thus increasing the efficiency of the attached earth grounding component 190.

The geothermal system 104 can be an air-based geothermal system, a fluid-based geothermal system or any other thermal conduction based technology geothermal climate system. Accordingly, the telecom utility closure 102 can be installed in aligned with the geothermal system 104 such that an exchange of the airflow, fluid flow or any other thermal conduction means between the telecom utility closure 102 and the geothermal system 104 is possible. Moreover, the geothermal system 104 can also be implemented on any other electronic equipment closure besides the telecom utility closure 102.

Figures 1, 1A, 2:
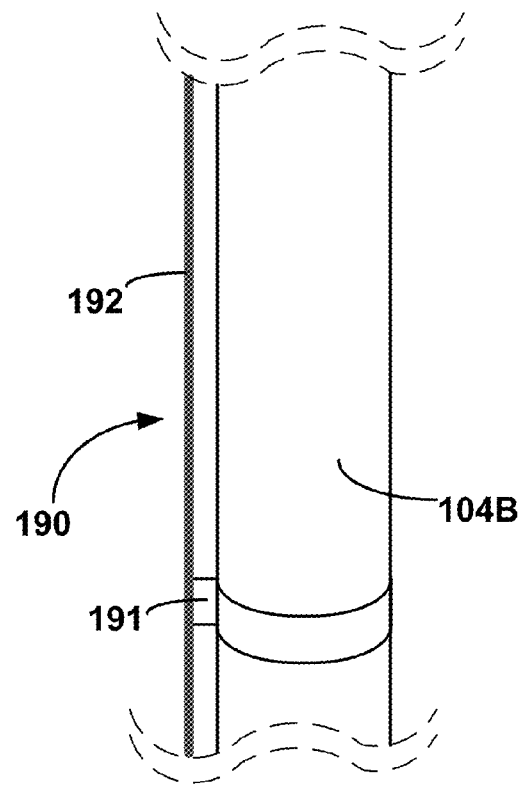
Figures 1, 1A, 2, 3:
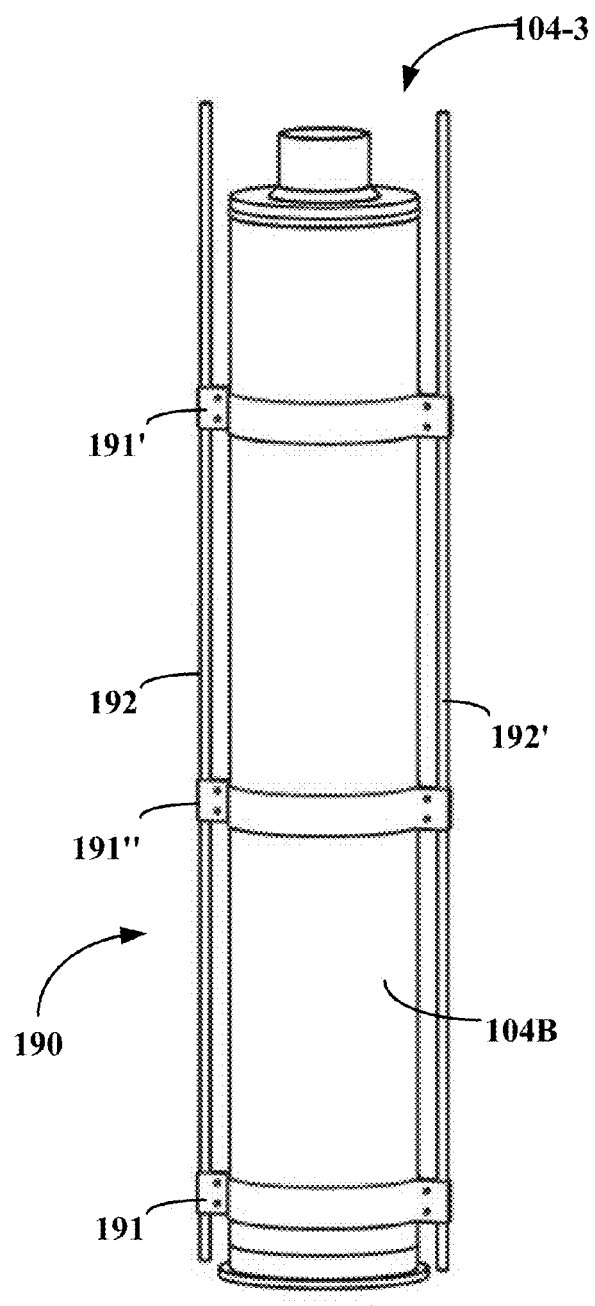
Figures 1, 1A, 2, 3, 4:
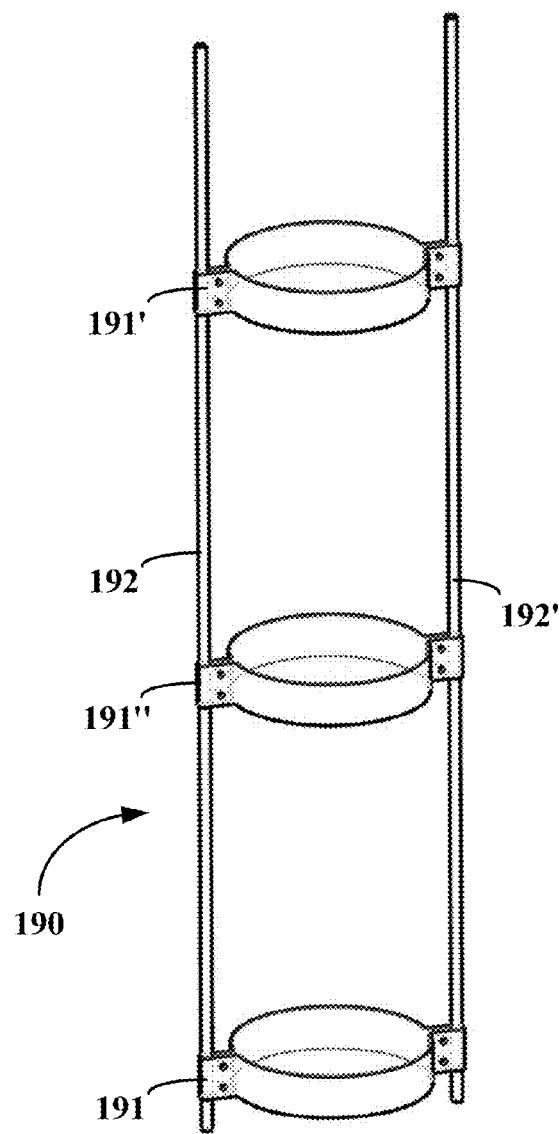
Figures 1, 1A, 2, 3, 4, 5:
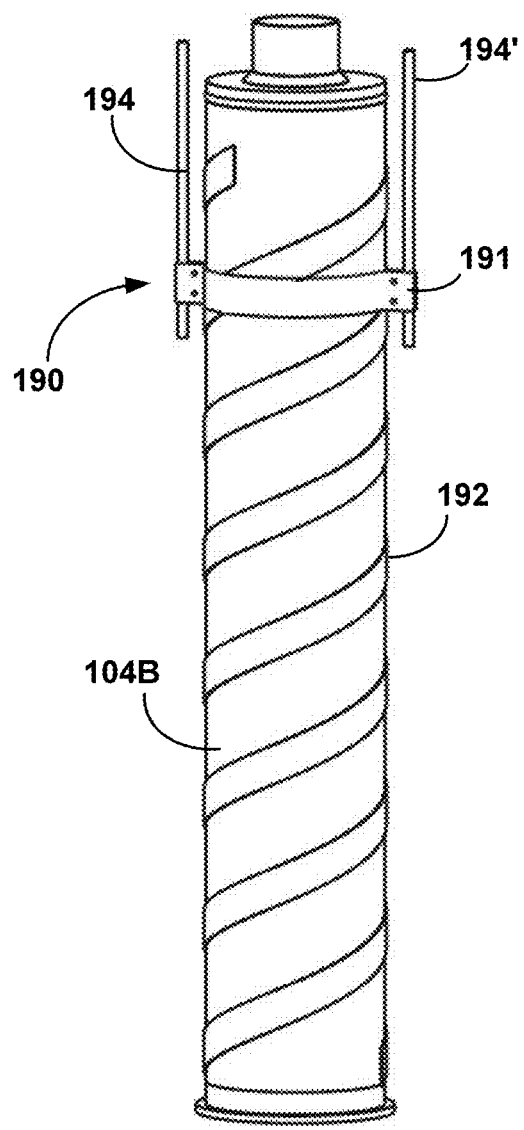

FIG. 1A-2 shows a partial view of an earth grounding component 190 in accordance with an embodiment of the disclosure. As shown, the earth grounding component 190 includes a conductive rod 192 coupled to and extended along heat exchange tube 104B. The conductive rod 192 is configured to electrically couple to a grounding interface of the electronic equipment. The conductive rod 192 may be mechanically (e.g. bolted with clamps or brackets) or molecularly (eg. welded or molded together) bonded to the heat exchange tube 104B. In one example, the conductive rod 192 may be directly bonded to the heat exchange tube 104B. In another example, as shown in FIG. 1A-2, a clamp 191 is set to hold around the heat exchange tube 104B, and the conductive rod 192 is mechanically or molecularly bonded to the clamp 191. When the outer surface of the heat exchange tube 104B or the clamp 191 is made of a material such as High Density Polyethylene (HDPE), ceramics or a shaped material coated with plastic or Polyurea on the outer surface, the mechanical means may be chosen for bonding the conductive rod 192 with the heat exchange tube 104B. Optionally, the conductive rod 192 is mechanically or molecularly bonded to the clamp 191 in a manner that the conductive rod 192 is spaced from the heat exchange tube 104B. The space between the conductive rod 192 and the heat exchange tube 104B can be used for protecting the heat exchange tube 104B from being damaged by voltage spikes from abnormal power sources such as lightning conducted by the conductive rod 192.

The conductive rod 192 may be a standard ground rod or a non standard ground rod. In one example, the conductive rod 192 may range in diameter from ⅝ inch to 1 inch, but is not limited to this range. The length of the conductive rod 192 may be equal to, or shorter than the geothermal component 104A for better structural support. Therefore, the depth where the conductive rod 192 is near the depth where the geothermal component 104A is placed or installed. For efficient grounding, the suggested depth is 10 feet or more than 10 feet. The conductive rod 192 may be made of conductive materials, such as any one or any combination of followings: a galvanized metal, carbon steel, stainless steel, monel, copper, a copper clad metal and bronze, etc. For saving the material and increasing the contact surface, the conductive rod 192 may also be hollow. The shape of cross section of the conductive rod 192 may be but not limited to round, ellipse, rectangle, flat strip, or diamond. For better contact to the soil, the earth grounding component 190 may include more than one conductive rod positioned around the heat exchange tube 104B. Optionally, more than one conductive rod may be electrically connected with each other. For example, the more than one conductive rod may be electrically connected by at least one conductive ring, conductive clamp or conductive wire.

In one example, the clamp 191 may be a sleeve clamp or a strap clamp, and be mechanically fixed at any part of the heat exchange tube 104B. Optionally, the earth grounding component 190 may also include more than one clamp placed along the heat exchange tube 104B.

In one example, the clamp 191 is conductive and is electrically coupled to the conductive rod 192. The clamp 191 may be made of conductive materials, such as any one or any combination of followings: galvanized metals, carbon steel, stainless steel, monel, copper, copper clad metals and bronze, etc. In this scenario, the clamp 191 may be optionally placed at the bottom of conductive rod 192 attached to the heat exchange tube 104B. This may increase the contact surface between the earth grounding component 190 and the deep earth soil. In another example, the surface facing to the heat exchange tube 104B of the clamp 191 may be made of a thermal insulated and/or electric insulated material. It can protect the heat exchange tube 104B from being damaged by voltage spikes from abnormal power sources such as lightning conducted by the conductive rod 192.

FIG. 1A-3 shows a geothermal system 104-3 in accordance with another embodiment of the disclosure. Different with what is shown in FIG. 1A-2, the earth grounding component 190 in this embodiment have multiple clamps (such as clamps 191, 191' and 191") and multiple conductive rods (such as conductive rod 192 and conductive rod 192'). Optionally, the multiple conductive rods may be electrically connected with each other. In one example, the clamp 191 is conductive and is electrically coupled to the conductive rod 192 and the conductive rod 192'. The clamp 191 may be made of conductive materials, such as any one or any combination of followings: galvanized metals, carbon steel, stainless steel, monel, copper, copper clad metals and bronze, etc. The clamp 191 may be optionally placed at the bottom of the conductive rod 192 and the conductive rod 192'. This may increase the contact surface between the earth grounding component 190 and the deep earth soil. Clamp 191' can be placed at any part of the heat exchange tube 104B. Optionally, the clamp 191' may be placed at the top of the heat exchange tube 104B. This may bring sufficient mechanical support for the conductive rod 192 and conductive rod 192'. The clamp 191, 191' or 191" may be a sleeve clamp or a strap clamp. The conductive rod 192 and conductive rod 192' may be positioned around the heat exchange tube 104B evenly or unevenly, to get sufficient contact to the low resistance underground soil. In practice, the number of the clamps or conductive rods included in the earth grounding component 190 is not limited to two and may vary based on the deep ground environment.

FIG. 1A-4 shows an isometric view of the earth grounding component 190 mentioned in FIG. 1A-3.

FIG. 1A-5 shows a geothermal cooling system in accordance with yet another embodiment of the disclosure. Different with what are shown in FIGS. 1A-2, 1A-3 and 1A-4, in this embodiment, the conductive rod 192 in the earth grounding component 190 extends along the exchange tube 104B in a spiral way instead of in a parallel way. This may increase the contact surface between the conductive rod 192 and the deep earth soil. Optionally, the conductive rod 192 may have a shape of strip for saving material and increasing the contact surface with the deep earth soil. The ratio of width/thickness of the strip may be set to certain value to achieve sufficient mechanical strength. In one example, the clamp 191 may be made of conductive materials, and is electrically coupled to the conductive rod 192. The clamp 191 may be optionally placed at the top of the conductive rod 192. Electrode rods 194 and 194' (the quantity of the electrode rods are not limited here) are coupled to the clamp 191 for electronically connecting the earth grounding component 190 to a grounding interface for the electronic equipment in the closure. In practice, the number of the clamps or conductive rods included in the earth grounding component 190 is not limited to the number mentioned in this embodiment, and may vary based on the deep ground environment.

In the above embodiments, the heat exchange tube 104B surrounded by the earth grounding component 190 may be one heat exchange tube or multiple heat exchange tubes, and the designs of the exchange tube 104B and interfaces in the geothermal system used to connect the electronic equipment closure are not limited here.

The earth grounding components described above may also be implemented in cases other than the geothermal system. Indeed, they can be implemented in cases which an element needs to be placed in an underground environment. The earth grounding component may be installed on the element placed in the underground environment. For example, the earth grounding component can be installed on a pile that support buildings on the ground or a pipe extended into the underground environment. One optional installation method may comprise: placing the earth grounding component in to a prepared hole; placing the element such as the pile or the pipe in to the space surrounded by the earth grounding component; backfilling the prepared hole with soil or backfill material with low resistance and/or high heat conduction rate. After the installation, at least one conductive rod of the earth grounding component may extend along the element, and electrically couple to a grounding interface of electronic equipment. At least one clamp of the earth grounding component may hold around the element, and mechanically or molecularly bond to the at least one conductive rod. Optionally, when the earth grounding component includes more than one conductive rod, the more than one conductive rod may be electrically connected to any one or any combination of followings that surround the element: a conductive ring, a conductive clamp, a conductive wire and a conductive foil. This may increase the contact surface between the earth grounding component and the earth soil.

In accordance with at least some embodiments, at least one heat exchange tube may be conductive. Therefore, the function of the earth grounding component may be integrated into the geothermal component 104A. The electronic equipment in the closure can be electrically coupled to the at least one conductive heat exchange tube through its grounding interface.

In accordance with at least some embodiments, the telecom utility closure 102 includes chambers such as equipment chambers, a power chamber, and a wiring chamber. As described herein, those chambers of the telecom utility closure 102 that generate heat (e.g., the equipment chamber, power chamber, etc.) may be arranged such that airflow for each heat generating chamber circulates through the geothermal system 104.

Figure 1B:
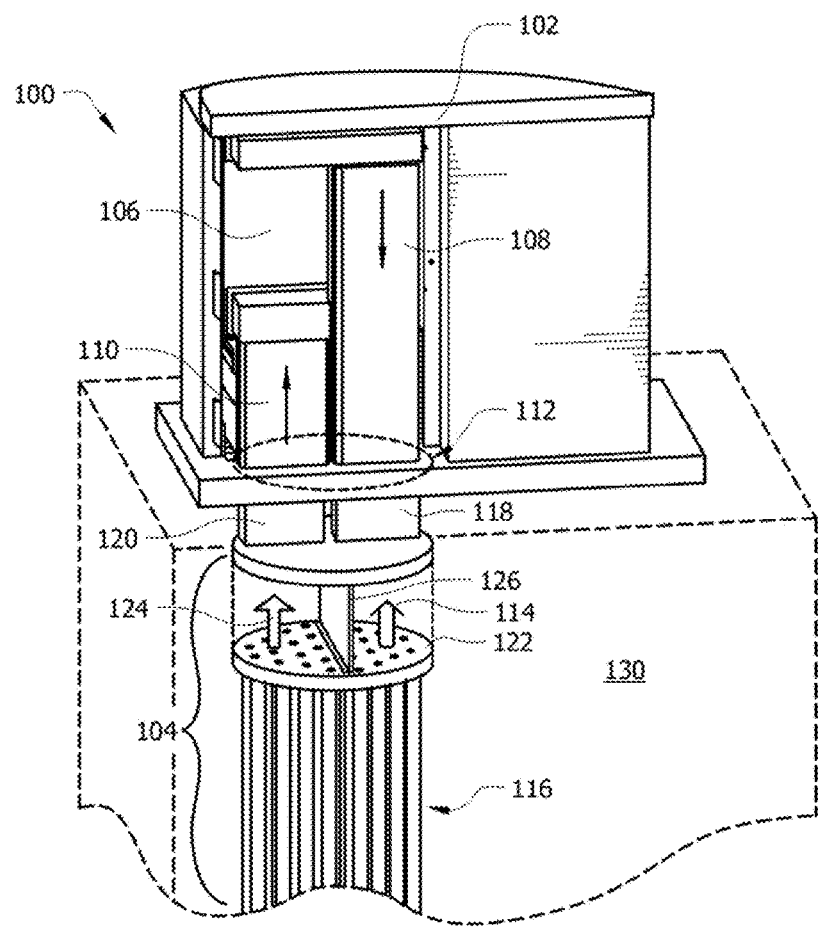
FIG. 1B shows a partial view of the system of FIG. 1A-1 showing airflow.

FIG. 1B shows a partial view of the system 100 of FIG. 1A-1 showing airflow. The configuration of an earth grounding component has been shown in FIG. 1A-1. For conciseness, the earth grounding component is not shown in the FIG. 1B. In FIG. 1B, a duct side of the telecom utility closure 102 is exposed (e.g., by removal or omission of a cover). As shown, the telecom utility closure 102 comprises a heat load chamber 106 that houses heat-generating electrical equipment. In operation, heated air within the heat load chamber 106 passes through an air introducing duct 108 to an air inlet duct 118 of the geothermal system 104. In at least some embodiments, the air introducing duct 108 and the inlet duct 118 correspond to separate ducts that form an unobstructed airway for heated air from the telecom utility closure 102 to be introduced to the geothermal system 104. As an example, a flexible connect system 112 may be used to connect the air introducing duct 108 and the inlet duct 118. Additionally or alternatively, at least one of the air introducing duct 108 and the inlet duct 118 may be flexible and/or may be designed to fit partially within the other (e.g., the air introducing duct 108 may be slightly smaller than the inlet duct 118 or vice versa).

Similarly, the air discharging duct 110 of the telecom utility closure 102 and the return duct 120 of the geothermal system 104 may correspond to separate ducts that form an unobstructed airway for cooled air from the geothermal system 104 to be returned to the telecom utility closure 102. Again, the flexible connect system 112 may be used to connect the air discharging duct 110 and the return duct 120. Additionally or alternatively, at least one of the air discharging duct 110 and the return duct 120 may be flexible and/or may be designed to fit within the other (e.g., the air discharging duct 110 may be slightly smaller than the return duct 120 or vice versa).

In FIG. 1B, heated air circulates from the inlet duct 118 to an input/output (I/O) manifold 114 of the geothermal system 104. In at least some embodiments, the I/O manifold 114 is divided by a plate 126, or other means, into two chambers—referred to herein as a "manifold inlet chamber" 122 and a "manifold return chamber" 124. In FIG. 1B, heated air passes through the manifold inlet chamber 122 and enters heat exchange tubes or pipes 116, where geothermal cooling takes place due to the contact of the heat exchange tubes 116 with soil. Air that has been circulated and cooled via passage through the heat exchange tubes 116 passes through manifold return chamber 124 of I/O manifold 114 in route to the telecom utility closure 102 via return duct 120 and air discharging duct 110.

Figure 1C:
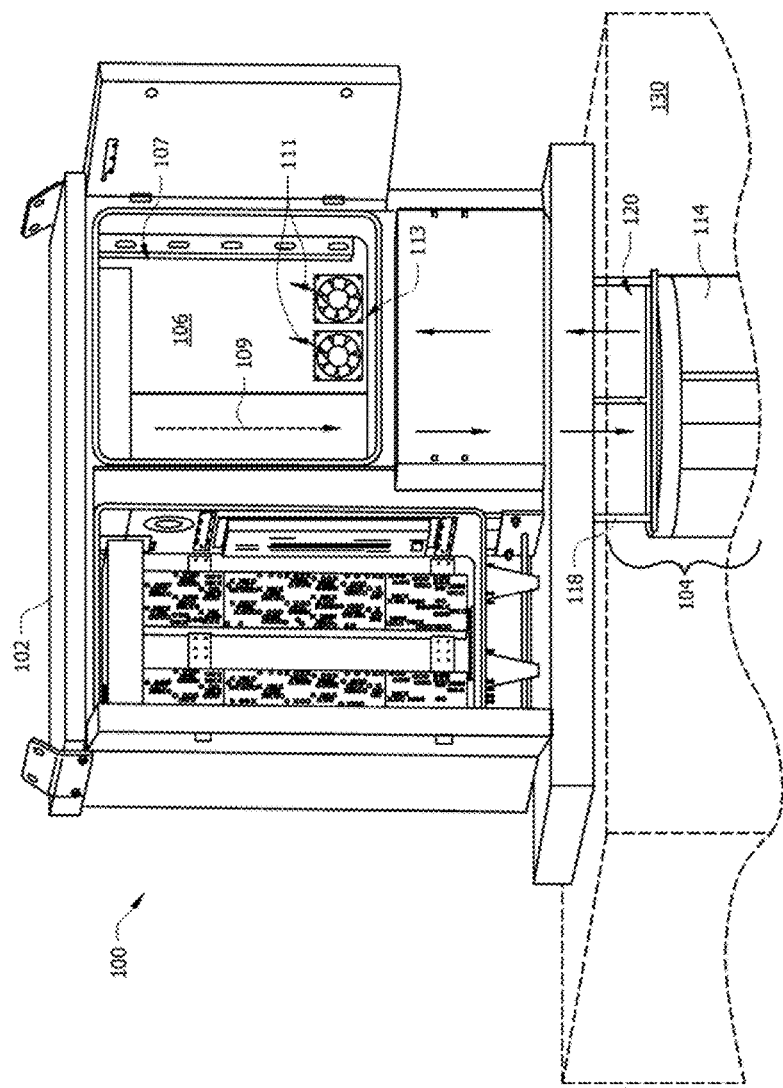
FIG. 1C shows another partial view of the system of FIG. 1A-1 showing airflow.

FIG. 1C shows another partial view of the system 100 of FIG. 1A-1 showing airflow. More specifically, the view of FIG. 1C shows the opposite side of the telecom utility closure 102 such that the heat load chamber 106 is exposed. As shown, airflow 109 (representing heated air) passes through a spacing 107 in the heat load chamber 106 to the air introducing duct 108, which is at least partially separated from the heat load chamber 106 by a divider, etc. The airflow 109 entering the air introducing duct 108 circulates to the inlet duct 118 and the I/O manifold 114 (e.g., the manifold inlet chamber 122) of the geothermal system 104. Air that passes through the geothermal system 104 is cooled and returns to the telecom utility closure 102 via the I/O manifold 114 (e.g., the manifold return chamber 124) and the return duct 120. In FIG. 1C, airflow 111 (representing cooled air) enters the heat load chamber 106 via air discharging duct 110, which is hidden in FIG. 1C. In at least some embodiments, return fans 113 are implemented to facilitate air circulation between the geothermal system 104 and the heat load chamber 106 of the telecom utility closure 102.

By circulating air between the heat load chamber 106 and the geothermal system 104, the temperature of the air in the heat load chamber 106 is maintained at a suitable threshold. For example, the particular geothermal system 104 used with the telecom utility closure 102 may have a predetermined cooling capacity and is selected to maintain the temperature of the air in the heat load chamber 106 below a predetermined threshold. Thus, air-based geothermal systems with different cooling capacities may be matched to different telecom utility closures with distinct cooling requirements.

In at least some embodiments, the geothermal system 104 also may include a radiator arranged in the air circulating loop. The radiator may comprise materials that extend into the soil or underground water and is made of HDPE, ceramics, stainless steel, or a shaped material coated with plastic or Polyurea on the outer surface.

Figure 1D:
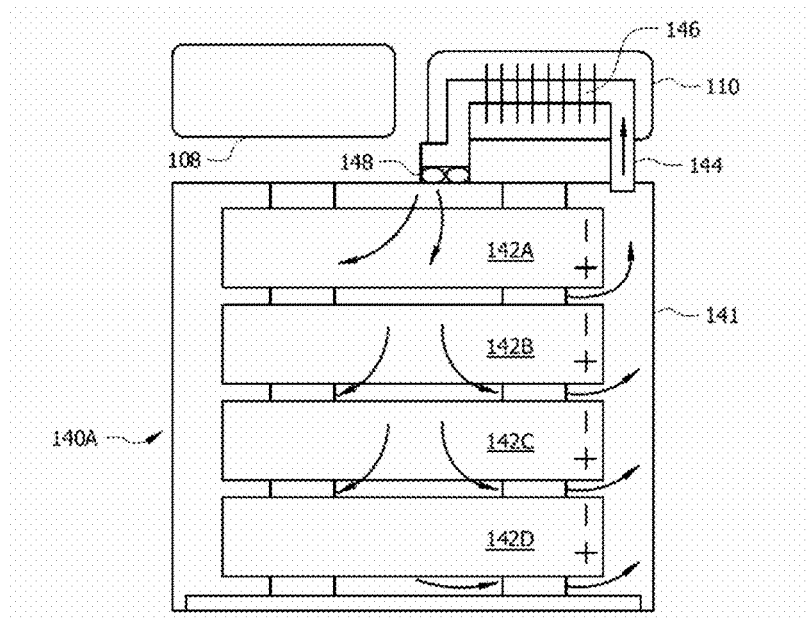
FIGS. 1D-1G show a battery base arrangement for the system of FIG. 1A-1 in accordance with an embodiment of the disclosure.
Figure 1E:
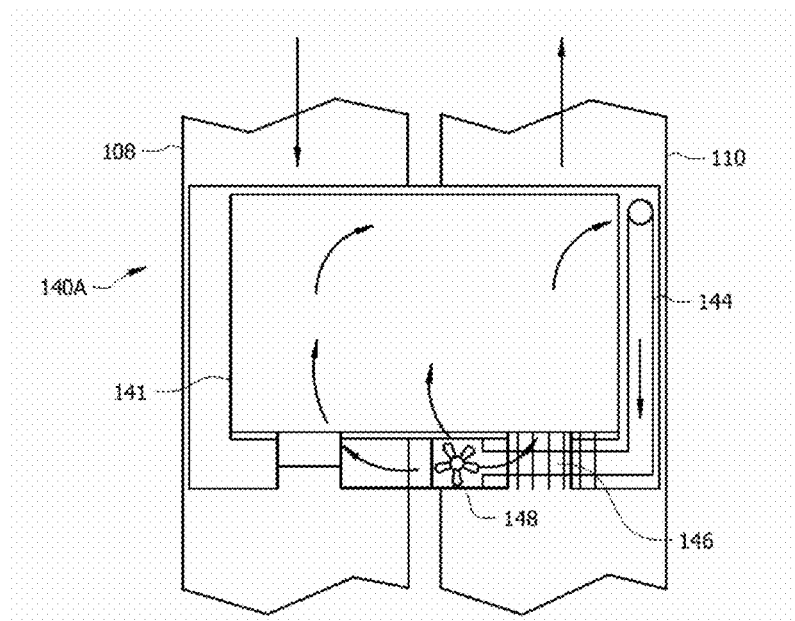
Figure 1F:
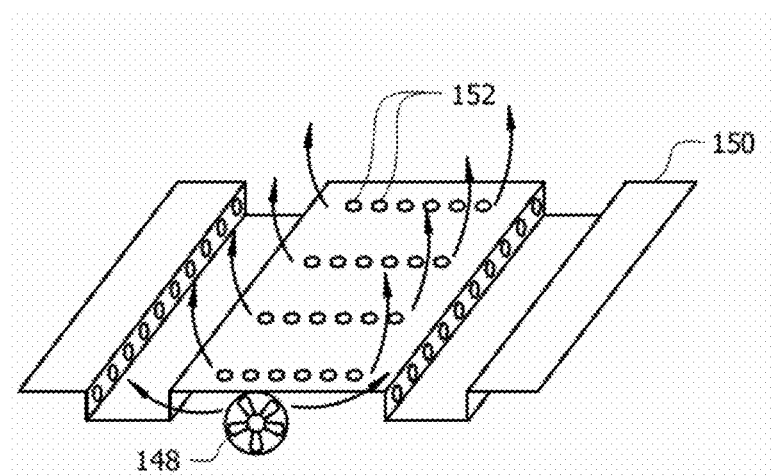
Figure 1G:
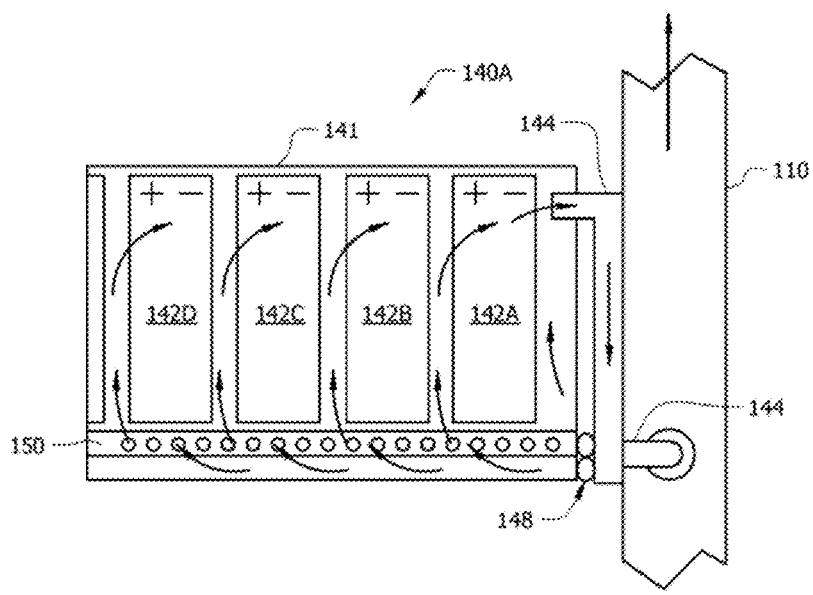
Figure 1H:
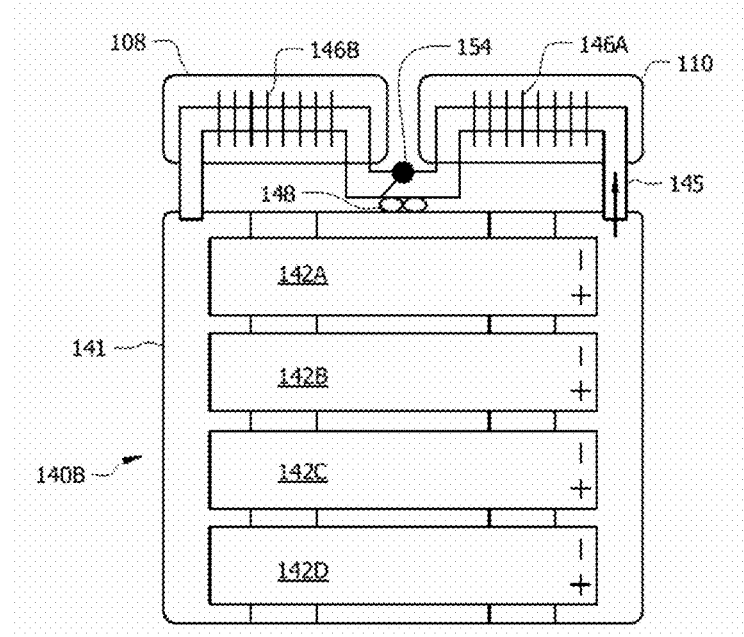
FIGS. 1H and 1I show another battery base arrangement for the system of FIG. 1A-1 in accordance with an embodiment of the disclosure.
Figure 1I:
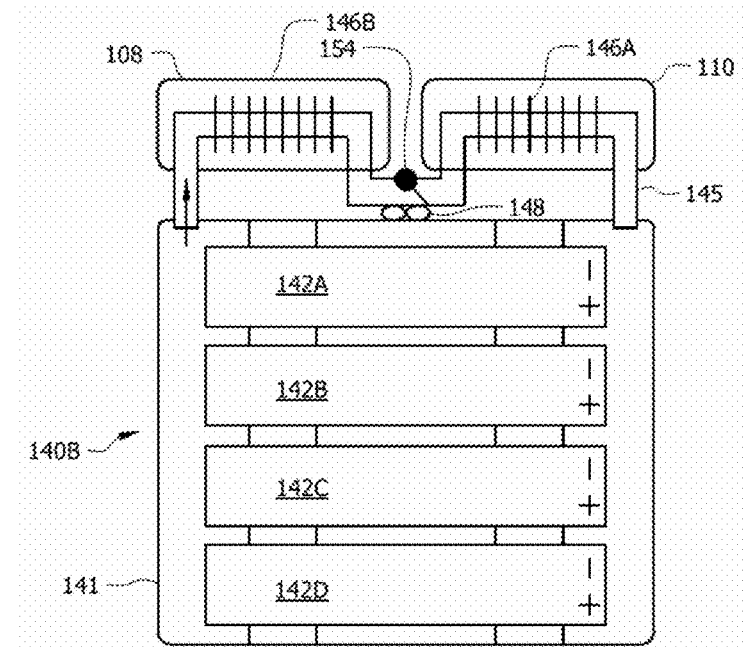

FIGS. 1D-1I show battery base arrangements 140A and 140B for the system 100. More specifically, FIG. 1D shows a top view of the battery base arrangement 140A, FIG. 1E shows a front view of the battery base arrangement 140A, FIG. 1F shows a base plate 150 associated with the battery base arrangement 140A, FIG. 1G shows a side view of the battery base arrangement 140A, FIG. 1H shows a top view of the battery base arrangement 140B during a cooling state, and FIG. 1I shows a top view of the battery base arrangement 140B during a heating state.

In FIG. 1D, a battery chamber 141 comprising a plurality of batteries 142A-142D is shown for the battery base arrangement 140A. To provide cooling for the battery chamber 141, an airflow duct 144 resides within air discharging chamber 110 and couples to the battery chamber 141. The airflow duct 144 is sealed at any junctions with the air discharging chamber 110 to prevent leakage of cooled air from the geothermal system 104. In at least some embodiments, the portion of the airflow duct 144 that resides within the air discharging chamber 110 comprises a heat exchange coil (i.e., a radiator) 146 to facilitate cooling of airflow in route to the battery chamber 141. One or more fans 148 also may be implemented along the airflow duct 144 to control airflow to the battery chamber 141.

As shown in FIG. 1E, cooled air from airflow duct 144 may enter the battery chamber 141 near its base with fan(s) 148 controlling airflow. Near the top of the battery chamber 141, heated air enters the airflow duct 144 and circulates back through the air discharging chamber 110 and the heat exchange coil 146 before entering the battery chamber 141 again. As shown in FIGS. 1F and 1G, the batteries 142A-142D rest on a battery base plate 150 that facilitates circulation of air underneath, between, and around the batteries via air holes 152.

In FIGS. 1H and 1I, a battery base arrangement 140B in which cooling and heating states are possible is shown. More specifically, FIG. 1H shows the battery base arrangement 140B during a cooling state, while FIG. 1I shows the battery base arrangement 140B during a heating state. To provide cooling or heating for the batteries 142A-142D in battery chamber 141, an airflow duct 145 extends through the air discharging chamber 110 and the air introducing chamber 108. The airflow duct 145 is sealed at any junctions with the air discharging chamber 110 and the air introducing chamber 108 to prevent leakage of air from the geothermal system 104. Although only one airflow duct 145 is shown, it should be understood that two separate airflow ducts could be used instead of one.

In battery base arrangement 140B, a valve 154 may control when the cooling state or the heating state is employed. For example, the valve 154 may control the airflow of heated air or cooled air into the battery chamber 141 by allowing airflow from the heating side of the airflow duct 145 (corresponding to the portion that resides in air introducing duct 108) to enter the battery chamber 141, but not allow airflow from the cooling side of the airflow duct 145 (corresponding to the portion that resides in air discharging duct 110) to enter the battery chamber 141, or vice versa. In at least some embodiments, the portion of the airflow duct 145 that resides within the air discharging chamber 110 comprises a heat exchange coil 146A to facilitate cooling the airflow in route to the battery chamber 141. Similarly, the portion of the airflow duct 145 that resides within the air introducing chamber 108 comprises a heat exchange coil 146B to facilitate heating the airflow in route to the battery chamber 141. One or more fans 148 also may be implemented along the airflow duct 145 to control airflow to the battery chamber 141 along with the valve 154.

Figure 1J:
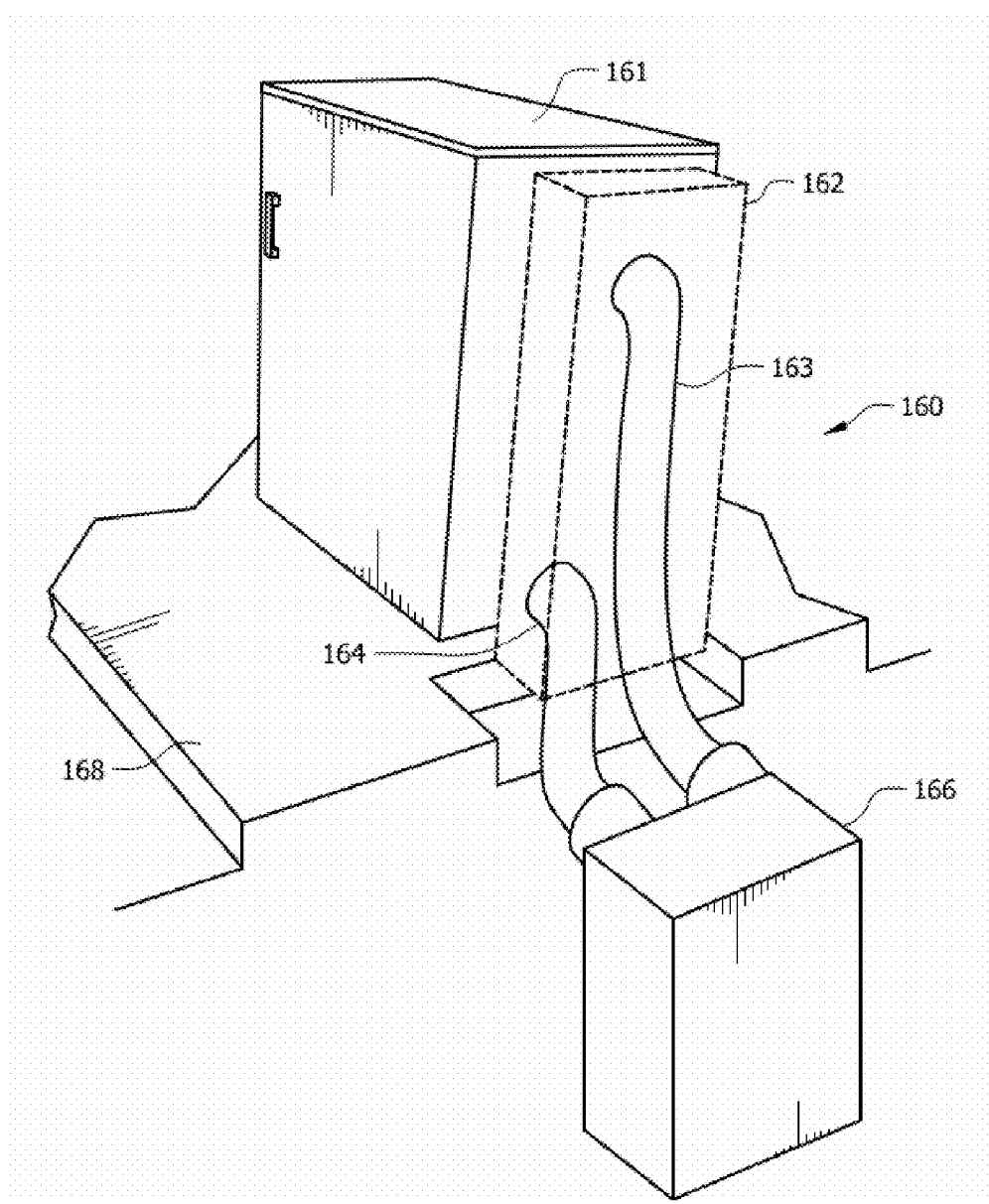
FIG. 1J shows a retrofit arrangement for an air-based geothermal system in accordance with an embodiment of the disclosure.

FIG. 1J shows a retrofit arrangement 160 for an air-based geothermal system in accordance with an embodiment of the disclosure. In FIG. 1J, the telecom utility closure 161 has been previously installed without an air-based geothermal system. Rather than remove the telecom utility closure 161, the retrofit arrangement 160 installs the air-based geothermal system 166 so that it is offset for the previously installed telecom utility closure 161 and base 168. To enable air circulation between the telecom utility closure 161 and the air-based geothermal system 166, flexible ducts 163 and 164 are employed. After connection of the flexible ducts 163 and 164 between airways in the telecom utility closure 161 and the air-based geothermal system 166, a cover 162 may be installed to protect the flexible ducts 163 and 164. It should be understood that retrofit arrangement 160 may involve modification to the chassis of the telecom utility closure 161 to provide airways for air circulation between the telecom utility closure 161 and the air-based geothermal system 166 via flexible ducts 163 and 164.

Figure 2A:
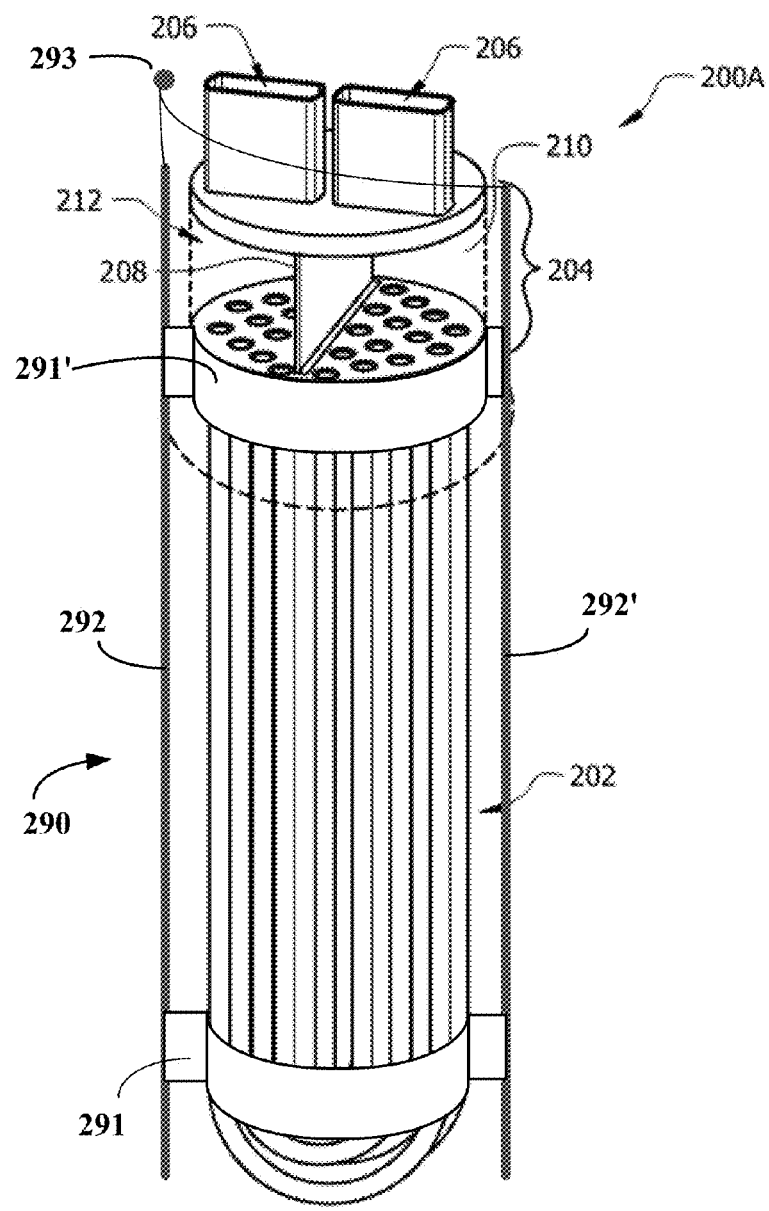
FIG. 2A shows an air-based geothermal system in accordance with embodiment of the disclosure.

FIG. 2A shows an air-based geothermal system 200A in accordance with an embodiment of the disclosure. As shown, the air-based geothermal system 200A comprises input/output (I/O) ducts 206, which may correspond to the inlet duct 118 and the return duct 120 described for FIGS. 1B and 1C. The I/O ducts 206 provide an airflow interface between a telecom utility closure and the underground components of the air-based geothermal system 200A. In at least some embodiments, an I/O manifold 204 is positioned between the I/O ducts 206 and heat exchange tubes 202. The I/O manifold 204 is divided (e.g., by a divider plate 208) into a manifold inlet chamber 210 and a manifold return chamber 212. The manifold inlet chamber 210 directs heated air received from a telecom utility closure further underground to the heat exchange tubes 202. The cooling of the heated air being circulated occurs due to the heat exchange tubes 202 being in contact with underground soil. As shown, each of the heat exchange tubes 202 forms a loop such that one end of each heat exchange tube 202 couples to the manifold inlet chamber 210 and the other end couples to the manifold return chamber 212.

The air-based geothermal system 200A may further comprise an earth grounding component 290 described previously. The earth grounding component 290 is used for providing earth grounding for the telecom utility closure. The earth grounding component 290 may include a conductive rod 292 coupled to and extended along the heat exchange tubes 202. A clamp 291 of the earth grounding component 290 is set at the bottom of the heat exchange tubes 202 to hold around the heat exchange tubes 202. The conductive rod 292 is mechanically or molecularly bonded to the clamp 291. In one example, the clamp 291 may be conductive and is electrically coupled to the conductive rod 292 for increasing the contact surface between the earth grounding component 290 and the deep earth soil. Optionally, the conductive rod 292 is mechanically or molecularly bonded to the clamp 291 in a manner that the conductive rod 292 is spaced from the heat exchange tubes 202. The space between the conductive rod 292 and the heat exchange tubes 202 can be used for protecting the heat exchange tubes 202 from being damaged by voltage spikes from abnormal power sources such as lightning conducted by the conductive rod 292. The conductive rod 292 is configured to electrically couple to a grounding interface 293 for the electronic equipment in the telecom utility closure. The telecom utility closure can be electrically coupled to the earth grounding component 290 through the grounding interface 293. After the air-based geothermal system 200A is installed in a hole underground and buried by soil or backfill material with low resistance and/or high heat conduction rate, the earth grounding component 290 may provide sufficiently low resistance through electrically coupling to the deep earth soil.

In practice, the number of the clamps or conductive rods included in the earth grounding component 290 may vary based on the deep ground environment. In one example, for better contact to the soil, the earth grounding component 290 may further include a conductive rod 292'. Optionally, the conductive rods 292' and 292 may be electrically connected with each other. In one example, the earth grounding component 290 may further include a clamp 291' placed at the top of the heat exchange tubes 202 for mechanical support.

In at least some embodiments, the I/O manifold 204 ensures that every heat exchange tube 202 receives a uniform amount of airflow and thus the air-based geothermal system 200A may have a reduced amount of friction loss, which occurs during air circulation. Further, the I/O manifold 204 enables the air-based geothermal system 200A to provide enough flow volume even at low speed air circulation (reducing power consumption and noise levels). More specifically, the rotational speed and/or number of fans/blowers implemented with the air-based geothermal system 200A is reduced, resulting in an improved cooling coefficient of performance (COP) and reduced noise levels (compared to other telecom utility closure cooling solutions).

Figure 2B:
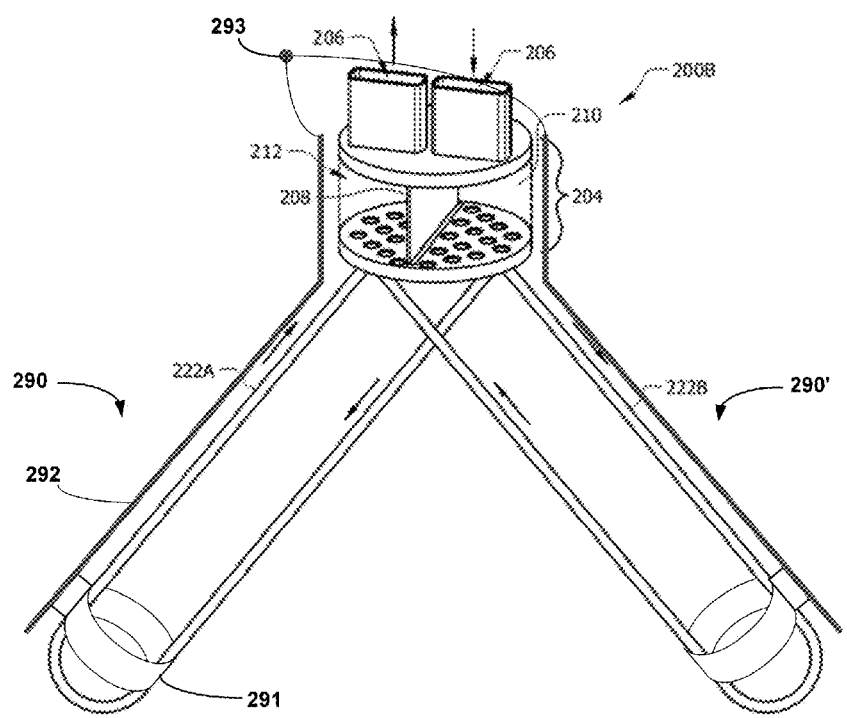
FIG. 2B shows an air-based geothermal system with heat exchange tubes in a V-shape arrangement in accordance with embodiment of the disclosure.

FIG. 2B shows an air-based geothermal system 2B with heat exchange tubes in a V-shape arrangement in accordance with embodiment of the disclosure. As shown, the air-based geothermal system 200B comprises an I/O manifold 204, I/O ducts 206, a divider plate 208, a manifold inlet chamber 210, and a manifold return chamber 212 arranged substantially similarly to those of air-based geothermal system 200A depicted in FIG. 2A. The difference between the air-based geothermal system 200A and the air-based geothermal system 200B is the angled (inverted V-shape) arrangement of the heat exchange tubes 222A and 222B. In other words, rather than being disposed substantially vertically as heat exchange tubes 202 are depicted in FIG. 2A, the heat exchange tubes 222A and 222B for the air-based geothermal system 200B are disposed in a substantially inverted V-shape arrangement such that the bottom ends of the heat exchange tubes 222A and 222B are substantially farther apart horizontally than are the tops of the heat exchange tubes 222A and 222B. Arranging the heat exchange tubes 222A and 222B in this manner reduces the heat exchange between the heat exchange tubes 222A and 222B (compared to employing a substantially vertical heat exchange tube arrangement) by increasing the volume of soil into which heat is released. Although only two heat exchange tubes 222A and 222B are shown, it should be understood that additional heat exchange tubes may similarly be angled in a V-shape arrangement. In at least some embodiments, angled heat exchange tubes, such as those shown for tubes 222A and 222B, may alternatively be arranged in a 3-sided pyramid arrangement, a 4-side pyramid arrangement, or a conical arrangement to reduce heat exchange between heat exchange tubes by increasing the amount of soil between the heat exchange tubes. The air-based geothermal system 200B may further comprise an earth grounding component 290 described previously. The earth grounding component 290 may be installed along the heat exchange tubes 222A. It may include a conductive rod 292 coupled to and extended along the heat exchange tubes 222A. It may further include a clamp(s) 291 set at the bottom of the heat exchange tubes 222A to hold around the heat exchange tubes 222A, and mechanically or molecularly coupled to the conductive rod 292. The conductive rod 292 is configured to electrically couple to a grounding interface 293 for the electronic equipment in the telecom utility closure. In practice, the number of the clamps or conductive rods included in the earth grounding component 290 may vary based on the deep ground environment. For better contact to the deep earth soil, another earth grounding component 290' may be installed along the heat exchange tubes 222B. The earth grounding components 290 and 290' may be electrically connected with each other. The multiple earth grounding components in a V-shape arrangement may compensate non-uniform distribution of underground earth resistances.

Figures 3A, 3B:
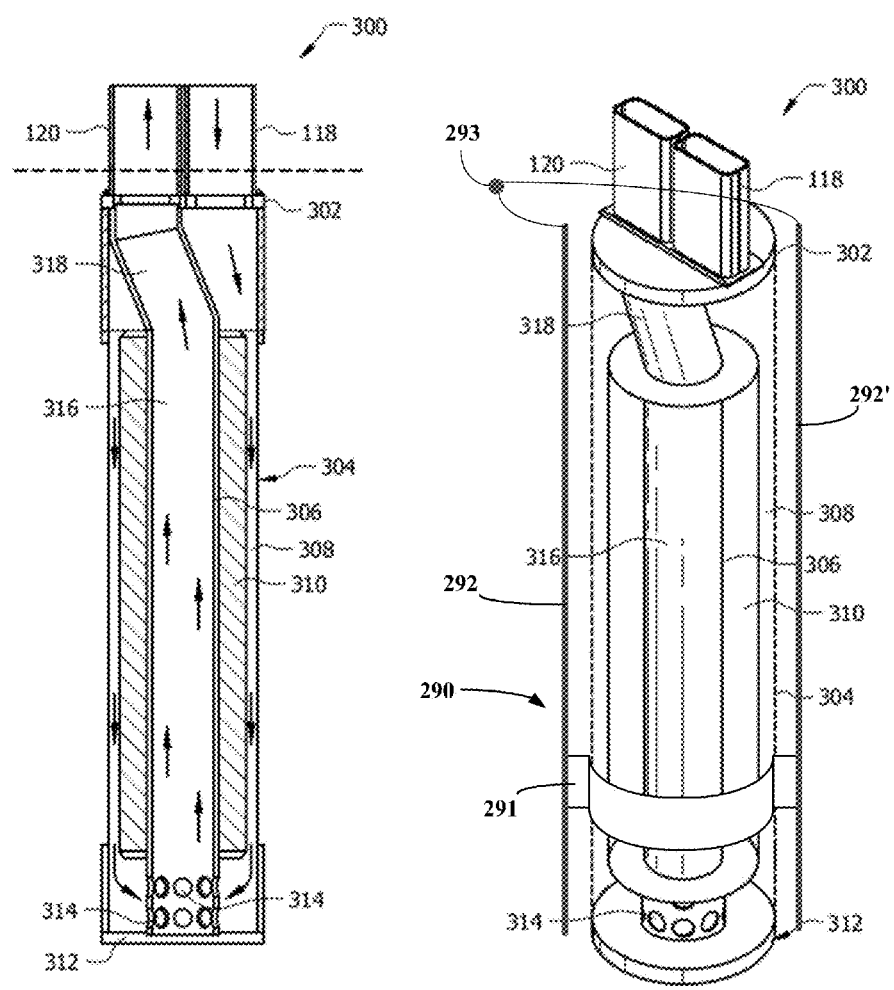
FIGS. 3A and 3B show another air-based geothermal system in accordance with an embodiment of the disclosure.

FIGS. 3A and 3B show another air-based geothermal system 300 in accordance with an embodiment of the disclosure. Specifically, FIG. 3A shows a cross-section of the air-based geothermal system 300 and FIG. 3B shows an isometric view of the air-based geothermal system 300. The configuration of an earth grounding component has been shown in FIG. 3B. For conciseness, the earth grounding component is not shown in the FIG. 3A. As shown in FIGS. 3A and 3B, the air-based geothermal system 300 comprises the inlet duct 118 and the return duct 120 described previously. In at least some embodiments, the air-based geothermal system 300 is intended to be installed into a hole such that only the inlet duct 118 and the return duct 120 are above the soil line. After installation of the air-based geothermal system 300, a telecom utility closure (e.g., closure 102) may be integrated with the air-based geothermal system 300 by coupling airways of the telecom utility closure (e.g., the air introducing duct 108 and the air discharging duct 110 in FIG. 1B) with the inlet duct 118 and the return duct 120 (i.e., an air circulation loop is formed).

The air-based geothermal system 300 also comprises an I/O manifold plate 302, which forms an airway between the inlet duct 118 and the return duct 120 and a plurality of heat exchange tubes. More specifically, the plurality of heat exchange tubes for the air-based geothermal system 300 include an outer heat exchange tube 304 and an inner heat exchange tube 306 inside the outer heat exchange tube 304. As shown, the outer heat exchange tube 304 extends further underground than the inner heat exchange tube 306 and is coupled directly to the I/O manifold plate 302 and a base plate 312. Meanwhile, the inner heat exchange tube 306 is positioned within the outer heat exchange tube 304 and does not couple directly to either the I/O manifold plate 302 or the base plate 312. As shown in FIG. 3B, the air-based geothermal system 300 may further comprise an earth grounding component 290 described previously. The earth grounding component 290 may include a conductive rods 292 and 292' coupled to and extended along the outer heat exchange tube 304. A clamp 291 is set at the bottom of the outer heat exchange tube 304 to hold around the outer heat exchange tube 304 and is mechanically or molecularly coupled to the conductive rods 292 and 292'. The conductive rods 292 and 292' are configured to electrically couple to a grounding interface 293 for the electronic equipment in the telecom utility closure. In practice, the number of the clamps or conductive rods included in the earth grounding component 290 may vary based on the deep ground environment.

In the air-based geothermal system 300, a spacing 308 between the outer heat exchange tube 304 and the inner heat exchange tube 306 forms an airway for air circulation. The spacing 308 is sized, for example, to maintain pressure of air being circulated within a predetermined range. At the base of the air-based geothermal system 300, the base plate 312 couples to the outer heat exchange tube 304 and directs airflow into return tube 316 via air return holes 314. The air entering return tube 316 is then circulated back toward the soil surface.

In at least some embodiments, the return tube 316 comprises an offset portion 318 that enables alignment of the return tube 316 with return duct 120. The offset portion 318 is positioned, for example, between the I/O manifold plate 302 and a top end of the inner heat exchange tube 306. In at least some embodiments, an insulation sleeve 310 is positioned between the inner heat exchange tube 306 and the return tube 316 to separate the return tube 316 from the heated airflow passing between the outer heat exchange tube 304 and the inner heat exchange tube 306. In this manner, the airflow in the return tube 316 does not absorb much heat, if any, from the heated air flowing through the spacing 308 between the outer heat exchange tube 304 and the inner heat exchange tube 306.

Figure 3C:
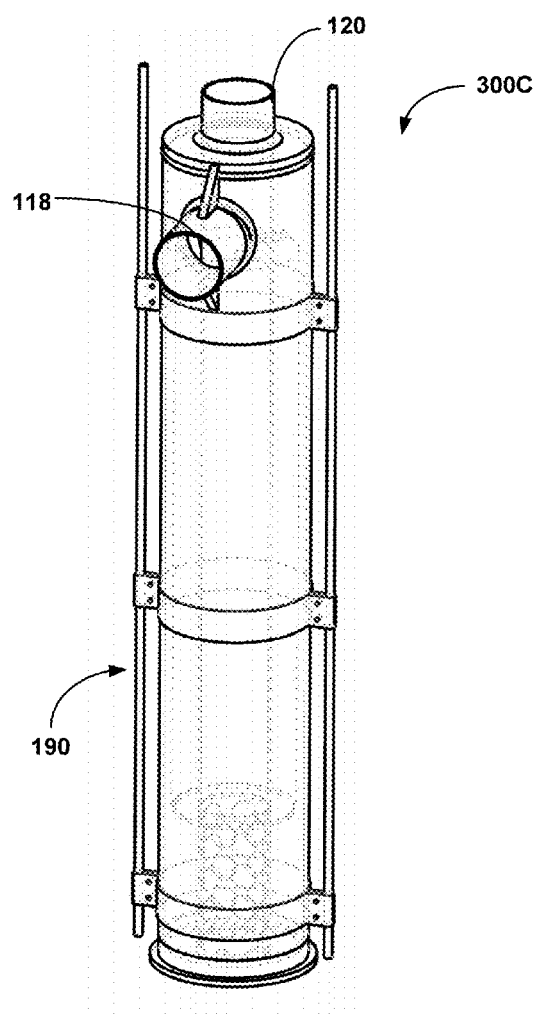
FIG. 3C shows another air-based geothermal system in accordance with an embodiment of the disclosure.

FIG. 3C shows another air-based geothermal system 300C in accordance with an embodiment of the disclosure. Different with what is shown in FIGS. 3A and 3B, in FIG. 3C, the inlet duct 118 is perpendicular to the return duct 120.

Figures 4A, 4B:
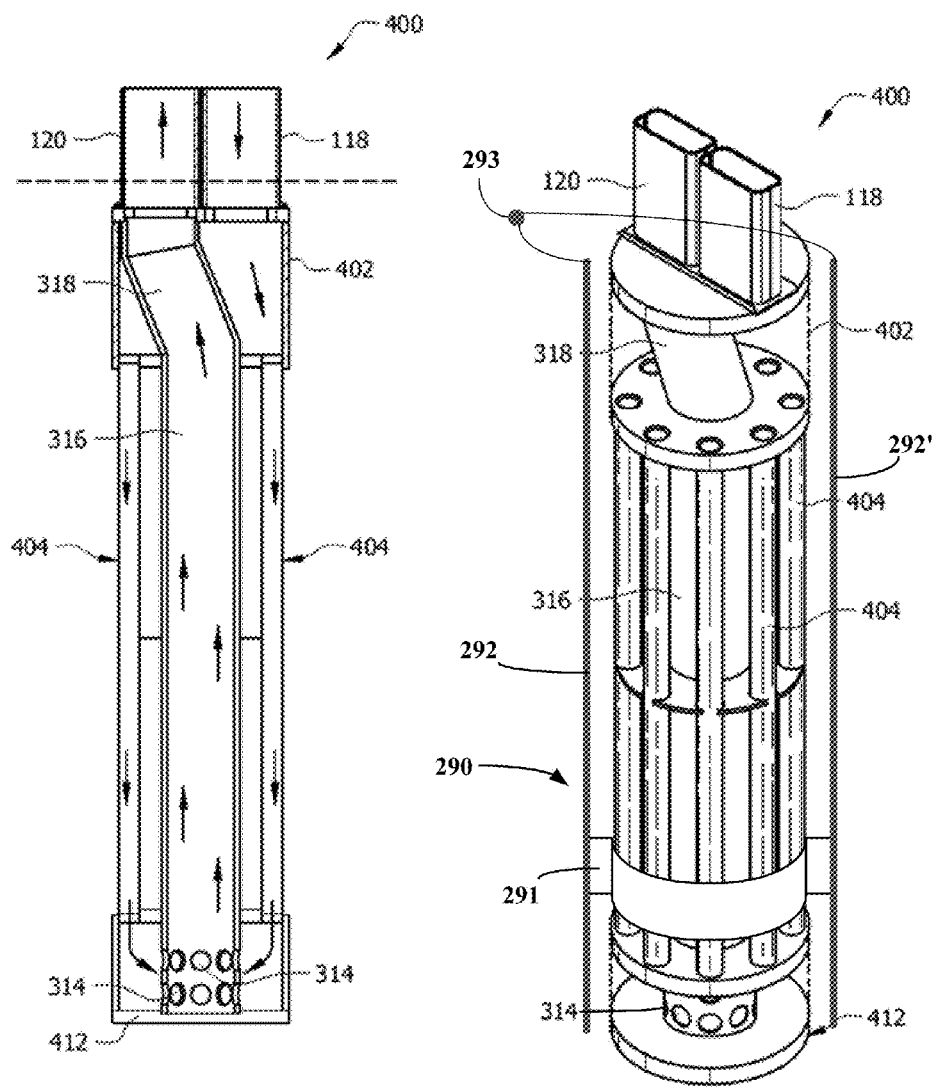
FIGS. 4A and 4B show another air-based geothermal system in accordance with an embodiment of the disclosure.

FIGS. 4A and 4B show another air-based geothermal system 400 in accordance with an embodiment of the disclosure. Specifically, FIG. 4A shows a cross-section of the air-based geothermal system 400 and FIG. 4B shows an isometric view of the air-based geothermal system 400. The configuration of an earth grounding component has been shown in FIG. 4B. For conciseness, the earth grounding component is not shown in the FIG. 4A. As shown in FIGS. 4A and 4B, the air-based geothermal system 400 comprises the inlet duct 118 and the return duct 120 described previously. In at least some embodiments, the air-based geothermal system 400 is intended to be installed into a hole such that only the inlet duct 118 and the return duct 120 are above the soil line. After installation of the air-based geothermal system 400, a telecom utility closure (e.g., closure 102) may be integrated with the air-based geothermal system 400 by coupling airways of the telecom utility closure (e.g., the air introducing duct 108 and the air discharging duct 110 in FIG. 1B) with the inlet duct 118 and the return duct 120 (i.e., an air circulation loop is formed).

In at least some embodiments, an I/O manifold 402 separates the return duct 120 and inlet duct 118 from heat exchange tubes 404. The I/O manifold 402 helps to ensure that the heat exchange tubes 404 receive a uniform amount of airflow and that there is sufficient flow volume, even with low speed air circulation. The I/O manifold 402 is divided by return tube 316 such that the airflow outside the return tube 316 is directed towards the heat exchange tubes 404 and the airflow inside the return tube 316 is directed towards return duct 120. In at least some embodiments, an offset portion 318 of return tube 316 resides in the I/O manifold 402 for alignment of the return tube 316 with the return duct 120. The air-based geothermal system 400 may further comprise an earth grounding component 290 described previously. The earth grounding component 290 may include a conductive rods 292 and 292' coupled to and extended along the heat exchange tubes 404. A clamp 291 is set at the bottom of the heat exchange tubes 404 to hold around the heat exchange tubes 404 and is mechanically or molecularly coupled to the conductive rods 292 and 292'. The conductive rods 292 and 292' are configured to electrically couple to a grounding interface 293 for the electronic equipment in the telecom utility closure. In practice, the number of the clamps or conductive rods included in the earth grounding component 290 may vary based on the deep ground environment.

The heat exchange tubes 404 of the air-based geothermal system 400 are spaced around the return tube 316 and are in contact with soil to enable transfer of heat from heated air circulating through the heat exchange tubes 404 to the soil. At the base of the air-based geothermal system 400, a base manifold chamber 412 provides an airway between the heat exchange tubes 404 and the return tube 316. Air that reaches the base manifold chamber 412 of the air-based geothermal system 400 enters return tube 316 via air return holes 314 and is circulated back toward the soil surface.

In the air-based geothermal system 400, the plurality of heat exchange tubes 404 are arranged in a radial pattern between the I/O manifold 402 and the base manifold chamber 412. This arrangement provides improved soil contact for the heat exchange tubes 404, which carry heated air. In at least some embodiments, the air-based geothermal system 400 employs a single return tube 316, larger than the heat exchange tubes 404, in the center of the air-based geothermal system 400. The return tube arrangement for the air-based geothermal system 400 maintains the air pressure within a desired range and is spaced from the heat exchange tubes 404 to reduce heat transfer from the heat exchange tubes to the return tube 316. The large return tube 316 also provides a convenient maintenance passage to facilitate installation, positioning or removal of equipment at the base of the air-based geothermal system 400. Examples of such equipment include, but are not limited to, inspection cameras, well pump components and/or liquid sensors.

Figure 4C:
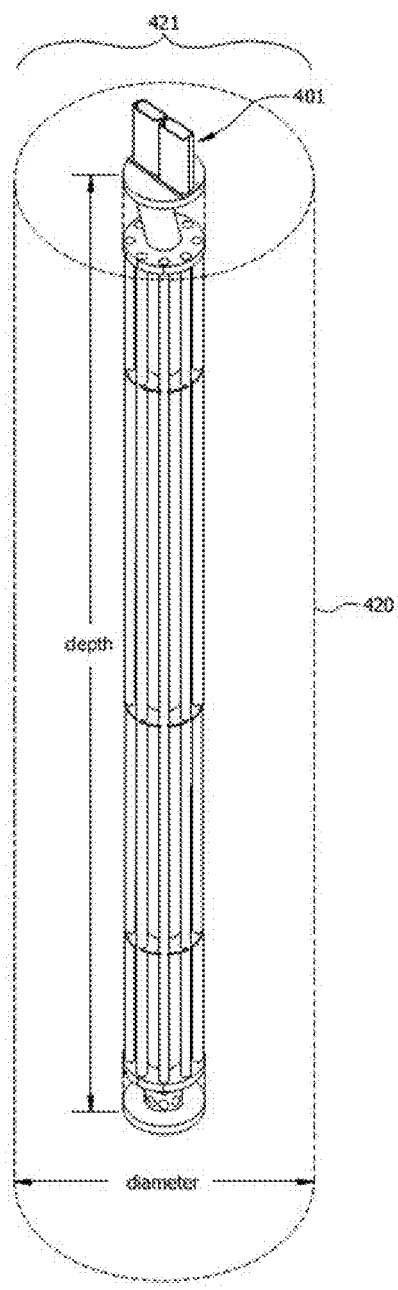
FIGS. 4C-4F show arrangements of air-based geothermal systems with approximations for affected soil volumes in accordance with embodiments of the disclosure.

FIGS. 4C-4F show arrangements of air-based geothermal systems with approximations for affected soil volumes in accordance with embodiments of the disclosure. In FIG. 4C, arrangement 421 shows an air-based geothermal system 401 with a diameter of approximately 2 feet and a depth of approximately 40 foot geothermal system. The affected soil volume from operation of the air-based geothermal system 401 corresponds to a soil cylinder 420 whose depth is approximately 40 feet and whose diameter is approximately 12 feet (i.e., the affected soil extends approximately 6 feet outward from heat exchange tubes of the air-based geothermal system 401. The air-based geothermal system 401 in combination with soil cylinder 420 in isolation provide approximately 1100 watts of cooling capacity (without regard to the cooling capacity of the telecom utility closure capacity).

Figure 4D:
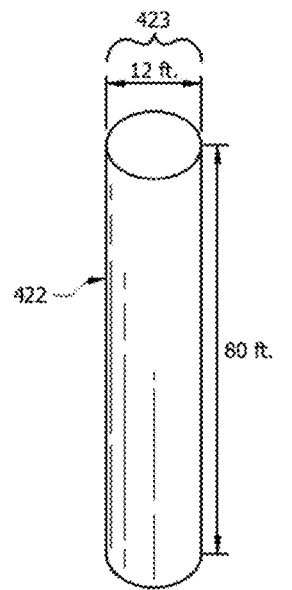

In FIG. 4D, arrangement 423 shows a soil cylinder 422 corresponding to an 80 foot air-based geothermal system. As shown, the soil cylinder 422 has a depth of approximately 80 feet and a diameter of approximately 12 feet. Accordingly, compared to soil cylinder 420 of arrangement 421, the soil cylinder 422 of arrangement 423 is twice as deep. Doubling the depth of an air-based geothermal system and the affected soil cylinder 422 as in arrangement 423 increases the cooling capacity by about 60% (compared to arrangement 421). Thus, the arrangement 423 provides approximately 1700 watts of cooling (compared to 1100 watts for the arrangement 421 of FIG. 4C). Meanwhile, to maintain the same airflow as arrangement 421, the fan power requirement for the arrangement 423 is approximately doubled.

Figure 4E:
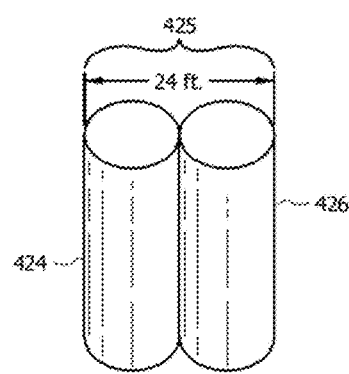

In FIG. 4E, the arrangement 425 shows adjacent soil cylinders 424 and 426 corresponding to adjacent 40 foot air-based geothermal systems. As shown, each of the adjacent soil cylinders 424 and 426 has a depth of approximately 40 feet and a diameter of approximately 12 feet. By properly spacing the adjacent soil cylinders 424 and 426 (adjacent with no overlap), heat exchange between the adjacent soil cylinders 424 and 426 is minimized such that the total cooling capacity for the arrangement 425 of FIG. 4E is approximately 2200 watts (i.e., double the cooling capacity of the arrangement 421 FIG. 4C). Meanwhile, the fan power requirement for arrangement 425 of FIG. 4E is approximately doubled compared to the fan power requirements for the arrangement 421 of FIG. 4C.

Figure 4F:
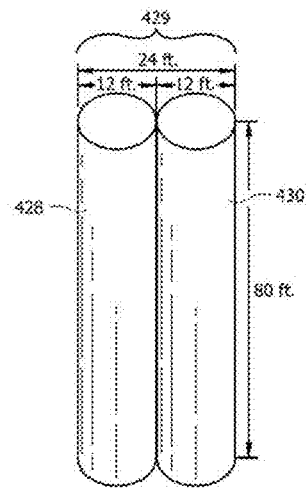

In FIG. 4F, arrangement 429 shows adjacent soil cylinders 428 and 430 corresponding to 80 foot air-based geothermal systems. As shown, each of the adjacent soil cylinders 428 and 430 has a depth of approximately 80 feet and a diameter of approximately 12 feet. By properly spacing the adjacent soil cylinders 428 and 430 (adjacent with no overlap), heat exchange between the adjacent soil cylinders 428 and 430 is minimized such that the total cooling capacity for the arrangement 429 of FIG. 4F is approximately 3400 watts (i.e., double the cooling capacity of the arrangement 423 of FIG. 4D). Meanwhile, the fan power requirement for arrangement 429 is approximately doubled compared to the arrangement 423 of FIG. 4D.

Figure 4G:
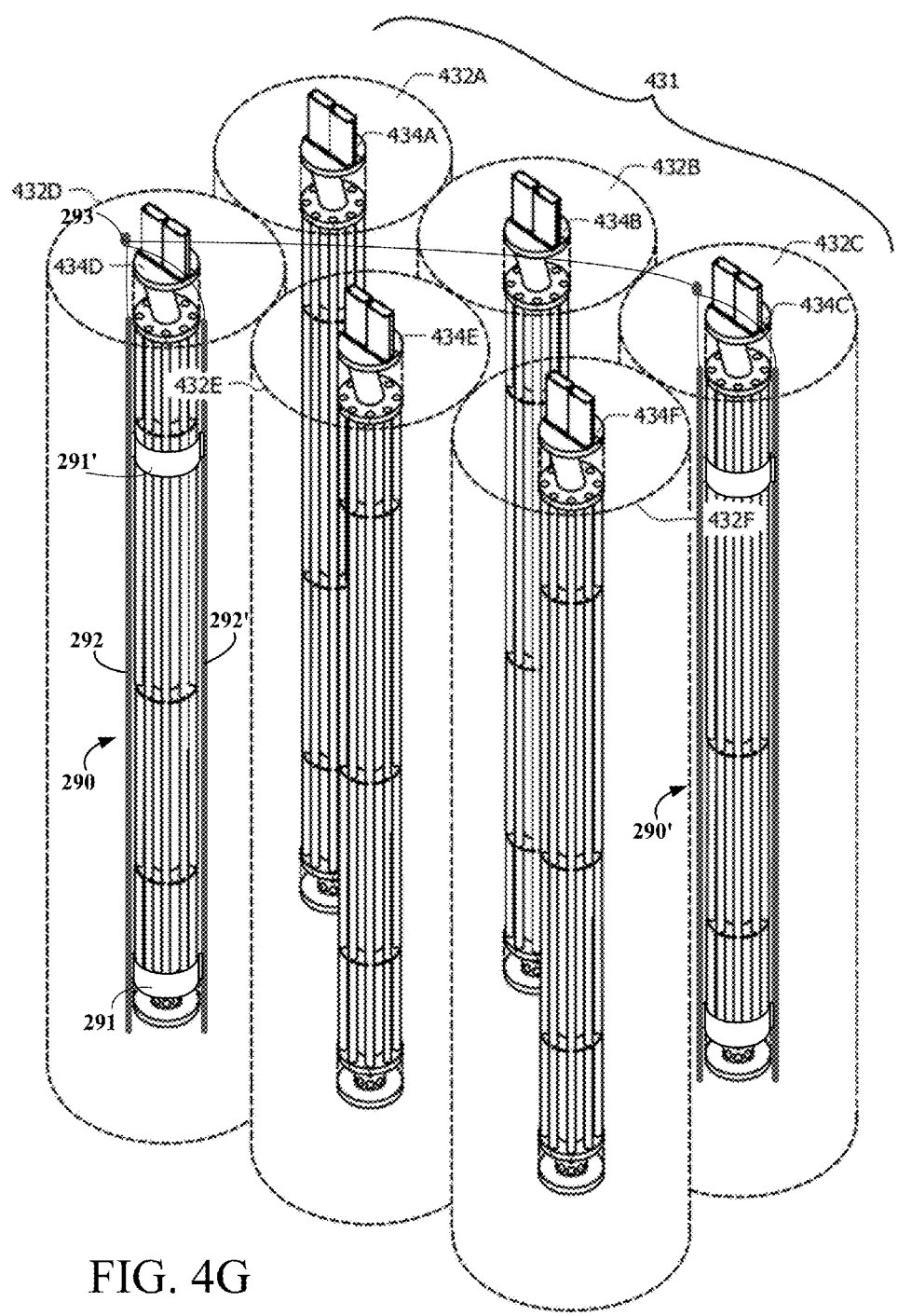
FIGS. 4G and 4H show six-pack arrangements of air-based geothermal systems in accordance with embodiments of the disclosure.

In FIG. 4G, a "six-pack" arrangement 431 of adjacent air-based geothermal systems 434A-434F and corresponding soil cylinders 432A-432F is shown. Each of the adjacent air-based geothermal systems 434A-434F and corresponding soil cylinders 432A-432F may have a depth of approximately 40 feet or 80 feet. Further, each of the soil cylinders 432A-432F has a diameter of approximately 12 feet. By properly spacing the adjacent soil cylinders 432A-432F (adjacent with no overlap), heat exchange between the adjacent soil cylinders 432A-432F is minimized such that the total cooling capacity for the arrangement 431 of FIG. 4G is approximately 6600 watts for 40 foot units and 10200 watts for 80 foot units. As shown in FIG. 4G, at least one air-based geothermal system of the systems 434A-434F, for example the air-based geothermal system 434D, may further comprise an earth grounding component 290 described previously. The earth grounding component 290 may include conductive rods 292 and 292' coupled to and extended along the heat exchange tubes 404D. A clamp 291 is set at the bottom of the heat exchange tubes 404D to hold around the heat exchange tubes 404D and is mechanically or molecularly coupled to the conductive rods 292 and 292'. A clamp 291' is set at the top of the heat exchange tubes 404D. The clamp 291 or 291' may be conductive and electrically coupled to the conductive rods 292 and 292'. The conductive rods 292 and 292' are configured to electrically couple to a grounding interface 293 for the electronic equipment in the telecom utility closure. In practice, the number of the clamps or conductive rods included in the earth grounding component 290 may vary based on the deep ground environment. For better contact to the deep earth soil, another earth grounding component 290' may be installed along the air-based geothermal system 434C. The earth grounding components 290 and 290' may be electrically connected with each other. The multiple earth grounding components in an arrangement that they spaced from each other may compensate non-uniform distribution of underground earth resistances.

Figure 4H:
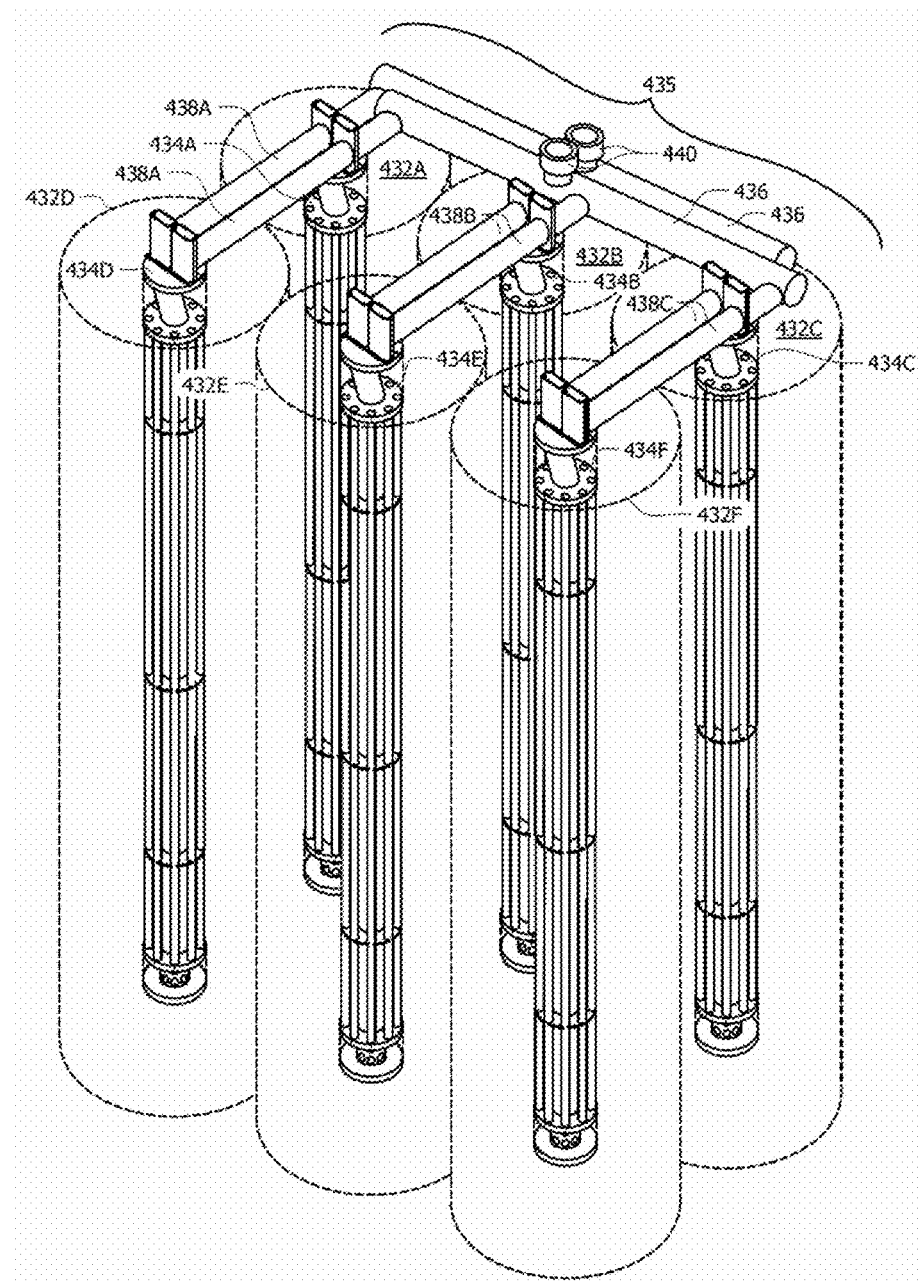

In FIG. 4H, another "six-pack" arrangement 435 of adjacent air-based geothermal systems 434A-434F and corresponding soil cylinders 432A-432F is shown. The six-pack arrangement 435 includes the same air-based geothermal systems 434A-434F and soil cylinders 432A-432F as disclosed for six-pack arrangement 431 of FIG. 4G. In addition, the six-pack arrangement 435 of FIG. 4H employs ducts 436 and 438A-438C to connect at least some the air-based geothermal systems 434A-434F together. The ducts 436 and 438A-438C facilitate air circulation between the air-based geothermal systems 434A-434F such that the capacity of the six-pack arrangement 435 is more evenly distributed and can be directed to equipment connectors 440. The position of the equipment connectors 440 may vary and may be separate from the individual I/O ducts for each air-based geothermal systems 434A-434F. The configuration of earth grounding components has been shown in FIG. 4G. For conciseness, the earth grounding component is not shown in the FIG. 4H.

Although FIGS. 4C-4H illustrates several arrangements for scaled air-based geothermal systems, it should be understood that other arrangements are possible. The depth, the diameter, the affected soil shape, and the cooling capacity described for the arrangements of FIGS. 4C-4H are intended to be an exemplary only and does not limit embodiments of the invention to any particular depth, diameter, affected soil shape, and cooling capacity.

Figure 4I:
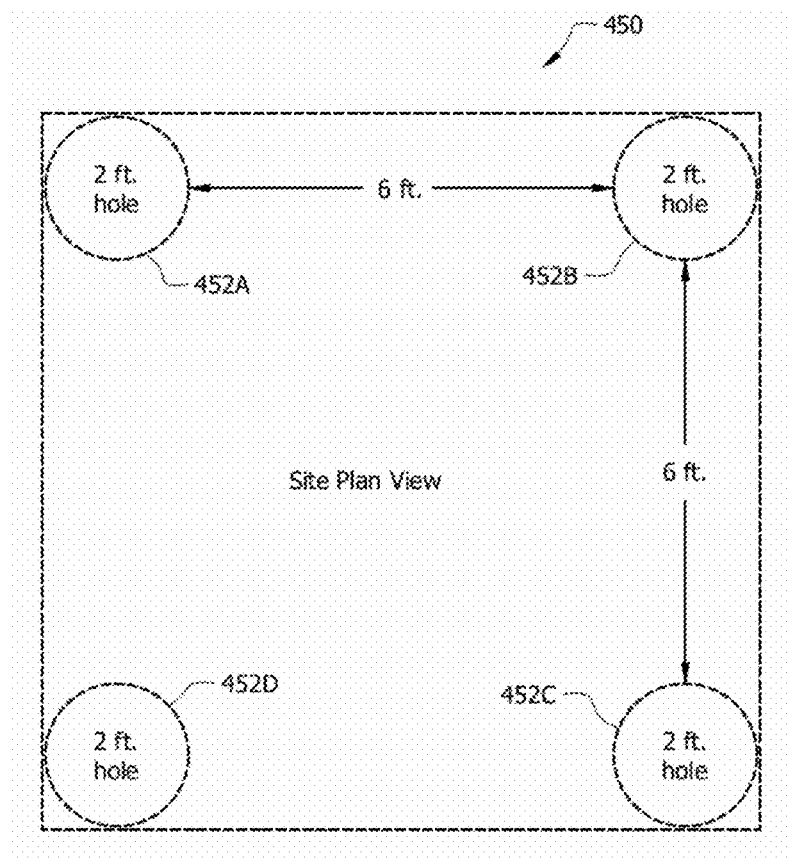
FIG. 4I shows a site plan view for adjacent air-based geothermal systems in accordance with an embodiment of the disclosure.

FIG. 4I shows a site plan view 450 for adjacent air-based geothermal systems in accordance with an embodiment of the disclosure. For the site plan view 450, each air-based geothermal system occupies a 2 foot hole 452A-452D and is spaced approximately 6 feet from adjacent air-based geothermal systems. With the site plan view 450, each air-based geothermal system and corresponding telecom utility closure is estimated to provide 700-1500 watts of cooling using 100 CFM of air (approximately 8 watts of power).

Figures 5A, 5B:
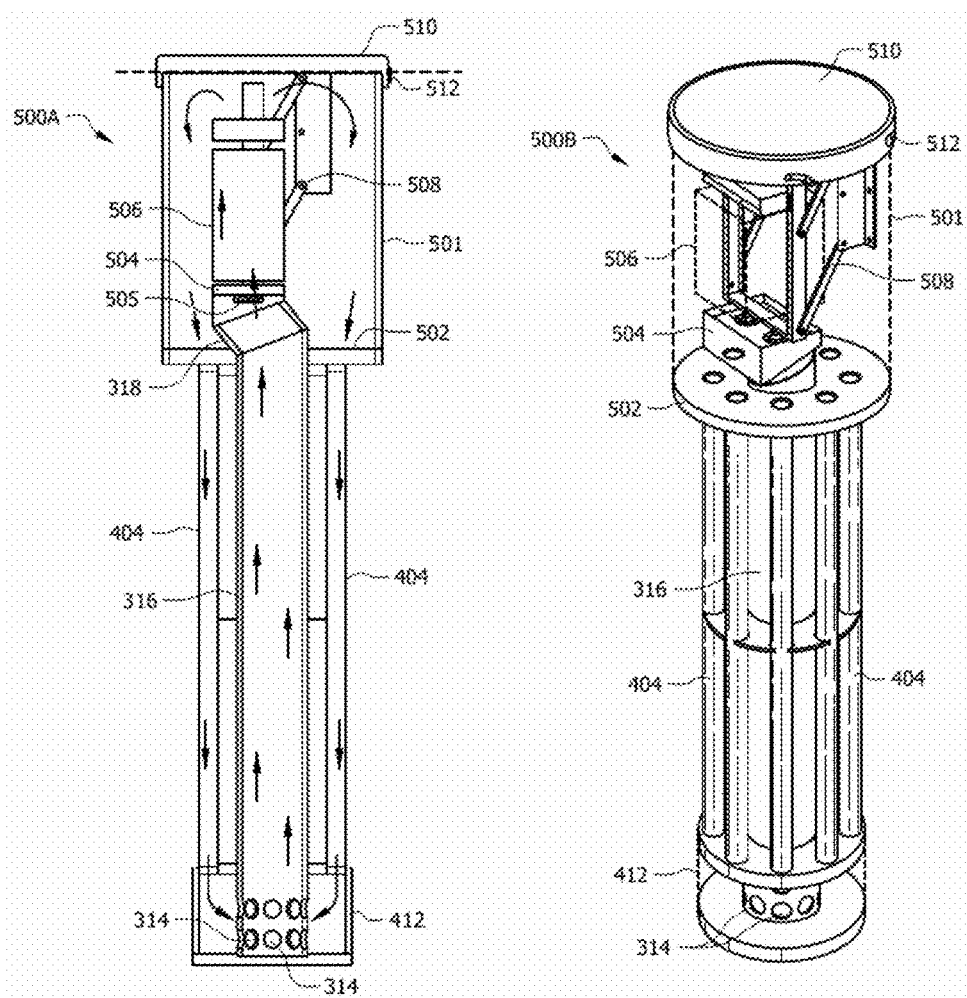
FIGS. 5A-5C show another air-based geothermal system in accordance with an embodiment of the disclosure.
Figure 5C:
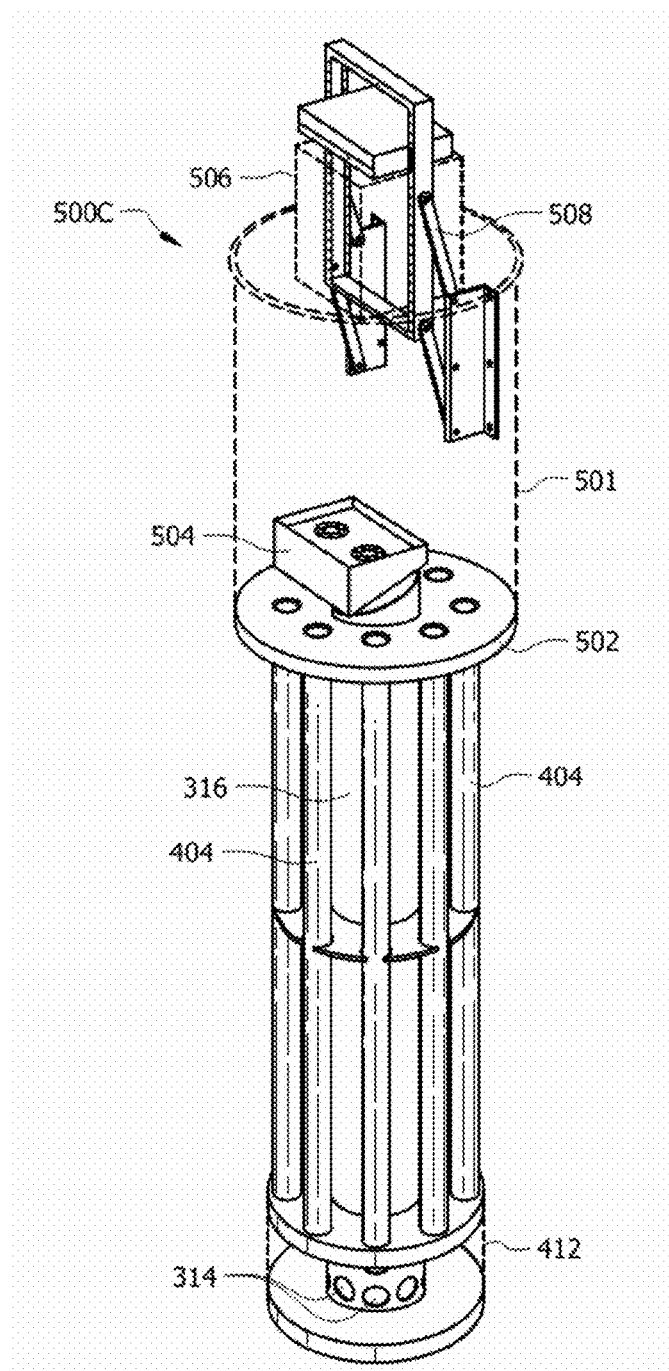

FIGS. 5A-5C show another air-based geothermal system 500 in accordance with an embodiment of the disclosure. The configuration of an earth grounding component on the air-based geothermal system 500 is similar to FIGS. 4A and 4B. For conciseness, the earth grounding component is not shown in the FIGS. 5A-5C. Specifically, FIG. 5A shows a cross-section of the air-based geothermal system 500, FIG. 5B shows an isometric view of the air-based geothermal system 500 with telecom utility closure equipment 506 lowered and covered, and FIG. 5C shows an isometric view of the air-based geothermal system 500 with telecom utility closure equipment 506 uncovered and raised. The air-based geothermal system 500 differs from the air-based geothermal systems 200, 300 and 400 because the air-based geothermal system 500 includes space for the telecom utility closure equipment 506 inside a sealable underground manifold chamber 501 of the air-based geothermal system 500. With the air-based geothermal system 500, there is no above-ground telecom utility closure. Further, the telecom utility closure equipment 506 may omit at least some enclosure materials related to above-ground telecom utility closures.

In FIGS. 5A-5C, the components below manifold chamber 501 correspond to the components below I/O manifold 402 for the air-based geothermal system 400. Accordingly, further description of these components is not given. In at least some embodiments, a lift frame 508 is integrated with the manifold chamber 501 to facilitate lowering the telecom utility closure equipment 506 into the manifold chamber 501 and later lifting the same equipment 506 out of the manifold chamber 501 (e.g., for servicing). At the base of the manifold chamber 501, an I/O manifold 502 provides an airway to the heat exchange tubes 404. The I/O manifold 402 helps to ensure that every heat exchange tube 404 receives a uniform amount of airflow and that there is sufficient flow volume, even with low speed air circulation.

Air circulating through the heat exchange tubes 404 and the return tube 316 is received by a return manifold 504 inside manifold chamber 501. In at least some embodiments, the return manifold 504 comprises at least one fan 505, which controls an air circulation rate for the air-based geothermal system 500. The airflow through the return manifold 504 is received by telecom utility closure equipment 506 positioned within a chamber that completes an air circulation loop. When sealed, the manifold chamber 501 becomes part of the air circulation loop for the air-based geothermal system 500.

In FIGS. 5A and 5B, a water-tight cover 510 is shown to cover the manifold chamber 501 and its contents. The water-tight cover 510 is compatible, for example with a lock ring 512 as in FIG. 5B. In FIG. 5C, the water-tight cover 510 has been removed and the lift frame 508 is shown in its raised position, which allows access to the telecom utility closure equipment 506.

The embodiments for geothermal systems 104, 200, 300, 400 and 500 correspond to vertical configurations for heat exchange tubes. The benefit of such vertical configurations is that the surface area affected by installation and use of the air-based geothermal system is small relative to other configurations. Further, the depth of installation for vertical configurations takes advantage of increasingly cooler ambient temperatures underground. Thus, the vertical configurations for heat exchange tubes, as in geothermal systems 104, 200, 300, 400 and 500, are more efficient than horizontal configurations for heat exchange tubes (i.e., less materials are needed to provide the same cooling capacity).

Figure 6:
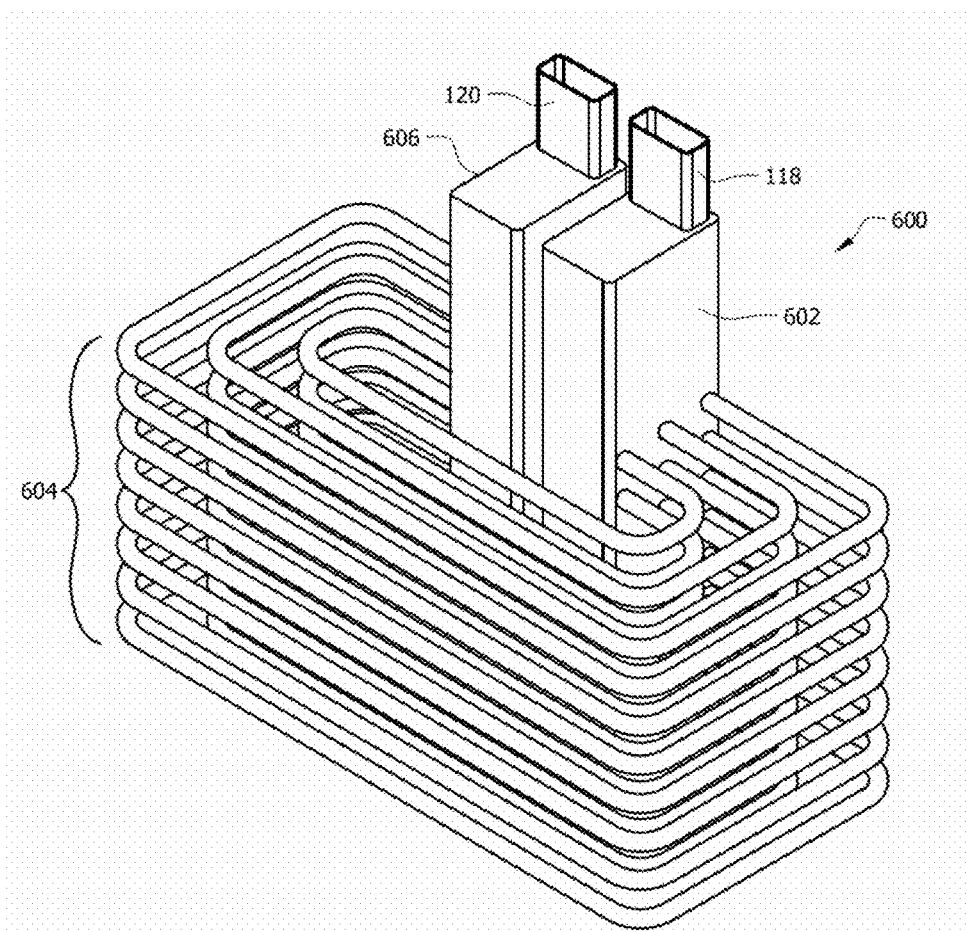
FIG. 6 shows another air-based geothermal system in accordance with an embodiment of the disclosure.

Due to site restrictions, rock formations and/or other digging difficulties, vertical configurations for an air-based geothermal system (e.g., systems 104, 200, 300, 400 and 500) is not always possible. In such cases, a shallow horizontal configuration for heat exchange tubes may be used. FIG. 6 shows another air-based geothermal system 600 in accordance with an embodiment of the disclosure, where the air-based geothermal system 600 uses a horizontal configuration for heat exchange tubes 604. As shown, the air-based geothermal system 600 comprises the inlet duct 118 and the return duct 120 described previously. In at least some embodiments, the air-based geothermal system 600 is intended to be installed into a hole such that only the inlet duct 118 and the return duct 120 are above the soil line. After installation of the air-based geothermal system 600, a telecom utility closure (e.g., closure 102) may be integrated with the air-based geothermal system 600 by coupling airways of the telecom utility closure (e.g., the air introducing duct 108 and the air discharging duct 110 in FIG. 1B) with the inlet duct 118 and the return duct 120 (i.e., an air circulation loop is formed).

To complete the air circulation loop, the inlet duct 118 couples to an inlet chamber 602. From the inlet chamber 602, air passes through a plurality of heat exchange tubes 604 to a return chamber 606. As shown, the heat exchange tubes 604 are in a horizontal configuration and are in contact with soil to cool heated air being circulated. From the return chamber 606, air is circulated back to return duct 120. The quantity, shape, size, and arrangement of the heat exchange tubes 604 may vary in accordance with a desired cooling capacity and efficiency considerations. Further, the depth and shape of the hole into which the air-based geothermal system 600 is installed may vary according to the size and shape of the air-based geothermal system 600.

Figure 7A:
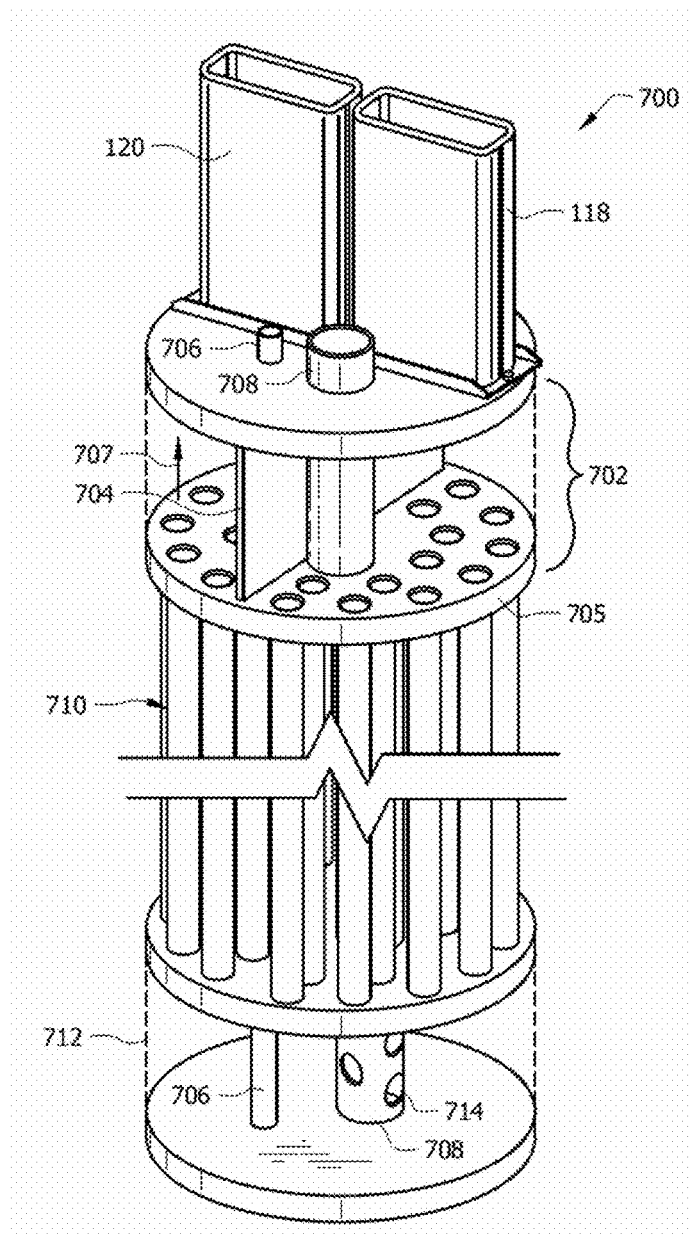
FIG. 7A shows another air-based geothermal system in accordance with an embodiment of the disclosure.

FIG. 7A shows another embodiment of an air-based geothermal system 700 in accordance with an embodiment of the disclosure. The configuration of an earth grounding component on the air-based geothermal system 700 is similar to FIG. 2A. For conciseness, earth grounding component is not shown in FIG. 7A. As shown in FIG. 7A, the air-based geothermal system 700 comprises the inlet duct 118 and the return duct 120 described previously. In at least some embodiments, the air-based geothermal system 700 is intended to be installed into a hole such that only the inlet duct 118 and the return duct 120 are above the soil line. After installation of the air-based geothermal system 700, a telecom utility closure (e.g., closure 102) may be integrated with the air-based geothermal system 700 by coupling airways of the telecom utility closure (e.g., the air introducing duct 108 and the air discharging duct 110 in FIG. 1B) with the inlet duct 118 and the return duct 120 (i.e., an air circulation loop is formed).

In at least some embodiments, an I/O manifold 702 separates the return duct 120 and inlet duct 118 from heat exchange tubes 710. The I/O manifold 702 helps to ensure that every heat exchange tube 710 receives a uniform amount of airflow and that there is sufficient flow volume even with low speed air circulation. The I/O manifold 702 is divided (e.g., by a divider plate 704) into a manifold inlet chamber (represented by arrow 705) that directs airflow from the inlet duct 118 into some of the heat exchange tubes 710, and into a manifold return chamber (represented by arrow 707) that directs airflow that circulated through the heat exchange tubes 710 back to the return duct 120.

The heat exchange tubes 710 of the air-based geothermal system 700 are spaced and are in contact with soil to enable transfer of heat from heated air circulating through the heat exchange tubes 710. At the base of the air-based geothermal system 700, a base manifold chamber 712 provides an airway between heat exchange tubes 710 carrying air downward towards the base of the air-based geothermal system 700 and other heat exchange tubes 710 carrying air upward towards the return duct 120. In other words, the heat exchange tubes 710 are coupled between a divided I/O manifold 702 and an open base manifold chamber 712 to complete an air circulation loop for the air-based geothermal system 700.

In at least some embodiments, the air-based geothermal system 700 comprises a leak detection maintenance tube 706 and/or a pump access maintenance tube 708. The leak detection maintenance tube 706 extends from a point above the I/O manifold 702 down to the base manifold chamber 712 and enables installation, servicing, and monitoring of leak detection sensors in the base manifold chamber 712. For example, a leak detector may be configured to detect when more than a threshold amount of liquid has gathered in the base manifold chamber 712. In such case, a pump is activated to extract the liquid via the pump access maintenance tube 708. Similar to the leak detection maintenance tube 706, the pump access maintenance tube 708 extends from a point above the I/O manifold 702 down to the base manifold chamber 712. The pump access maintenance tube 708 enables installation, servicing, and monitoring of pump components in the base manifold chamber 712, where liquid is most likely to accumulate should leakage occur in the air-based geothermal system 700. As shown, a portion of the pump access maintenance tube 708 that extends into the base manifold chamber 712 may comprise holes to enable the passage of liquid from the base manifold chamber 712 to the soil surface.

Figure 7B:
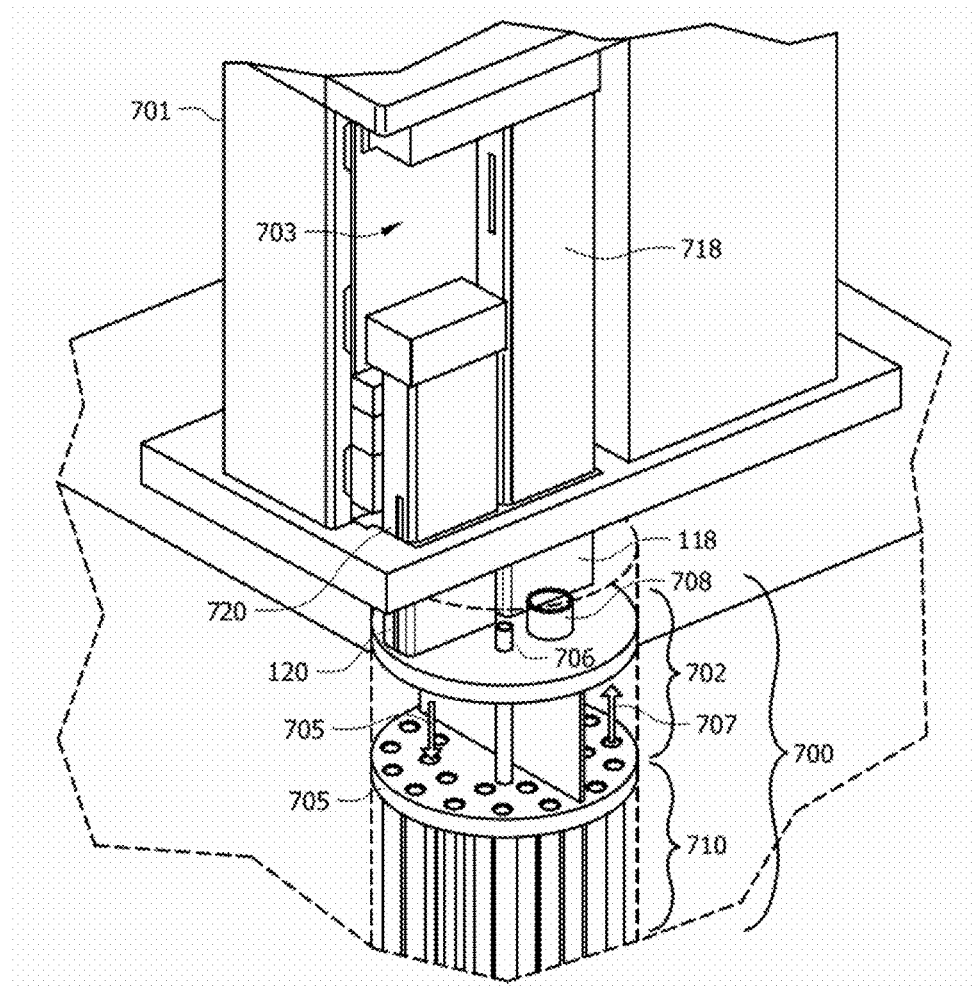
FIGS. 7B-7D show the air-based geothermal system of FIG. 7A in use with a telecom utility closure.
Figures 7C, 7D:
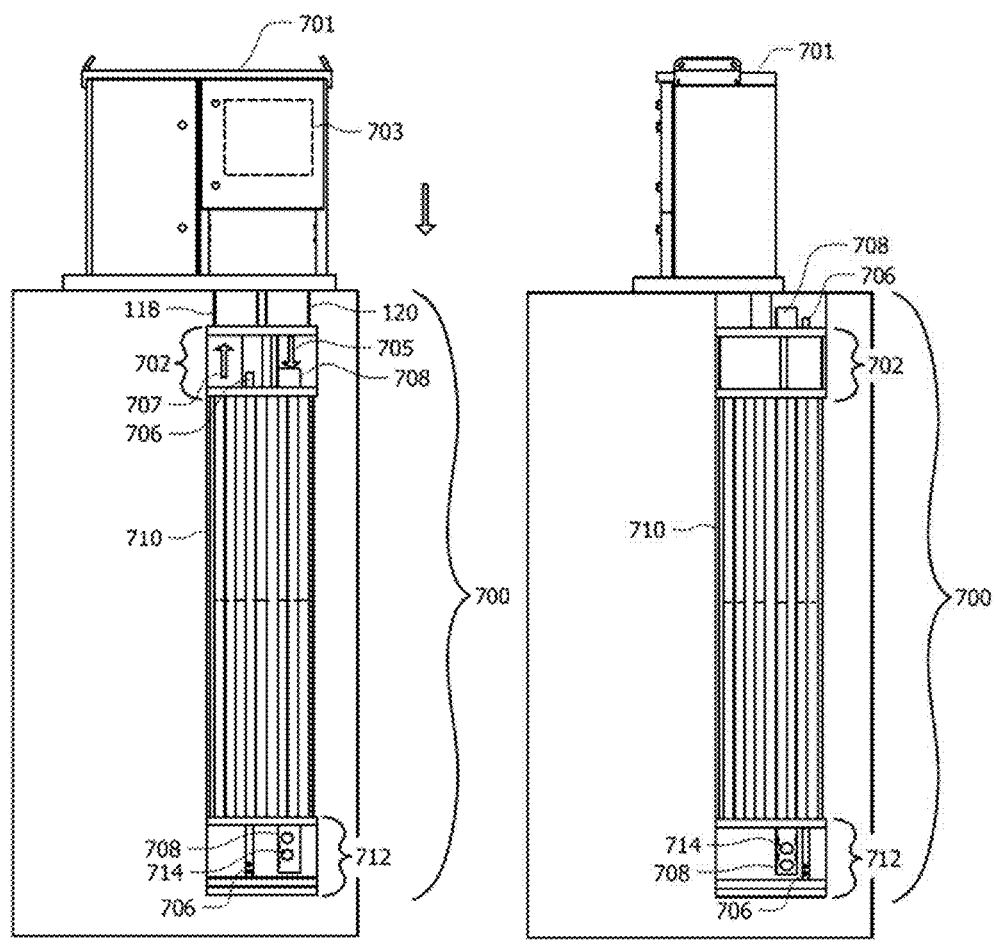

FIGS. 7B-7D show the air-based geothermal system 700 of FIG. 7A in use with a telecom utility closure 701. The configuration of an earth grounding component on the air-based geothermal system 700 is similar to FIG. 2A. For conciseness, the earth grounding component is not shown in FIGS. 7B-7D. In FIG. 7B, the telecom utility closure 701 is positioned over the air-based geothermal system 700 such that an air circulation loop is formed by joining inlet duct 118 with an air discharging duct 718 of the telecom utility closure 701 and joining return duct 120 with an air introducing duct 720 of the telecom utility closure 701. Specifically, the air discharging duct 718 carries heated air from heat load chamber 703 to the air-based geothermal system 700, while the air introducing duct 720 carries cooled air from the air-based geothermal system 700 back to the heat load chamber 703. The other components shown in FIG. 7B related to air-based geothermal system 700 were described for FIG. 7A and thus further description is not given.

In FIG. 7C, the positioning of the air-based geothermal system 700 with respect to the telecom utility closure 701 is shown. As shown in FIG. 7C, the air-based geothermal system 700 is aligned with the heat load chamber 703 of the telecom utility closure 701 to facilitate completion of the air circulation loop between the heat load chamber 703 and the air-based geothermal system 700. In FIG. 7D, the positioning of the air-based geothermal system 700 with respect to the telecom utility closure 701 is shown from another angle. As shown in FIG. 7D, the air-based geothermal system 700 is slightly offset from the telecom utility closure 701 to facilitate access to the leak detection maintenance tube 706 and the pump access maintenance tube 708.

Figure 8:
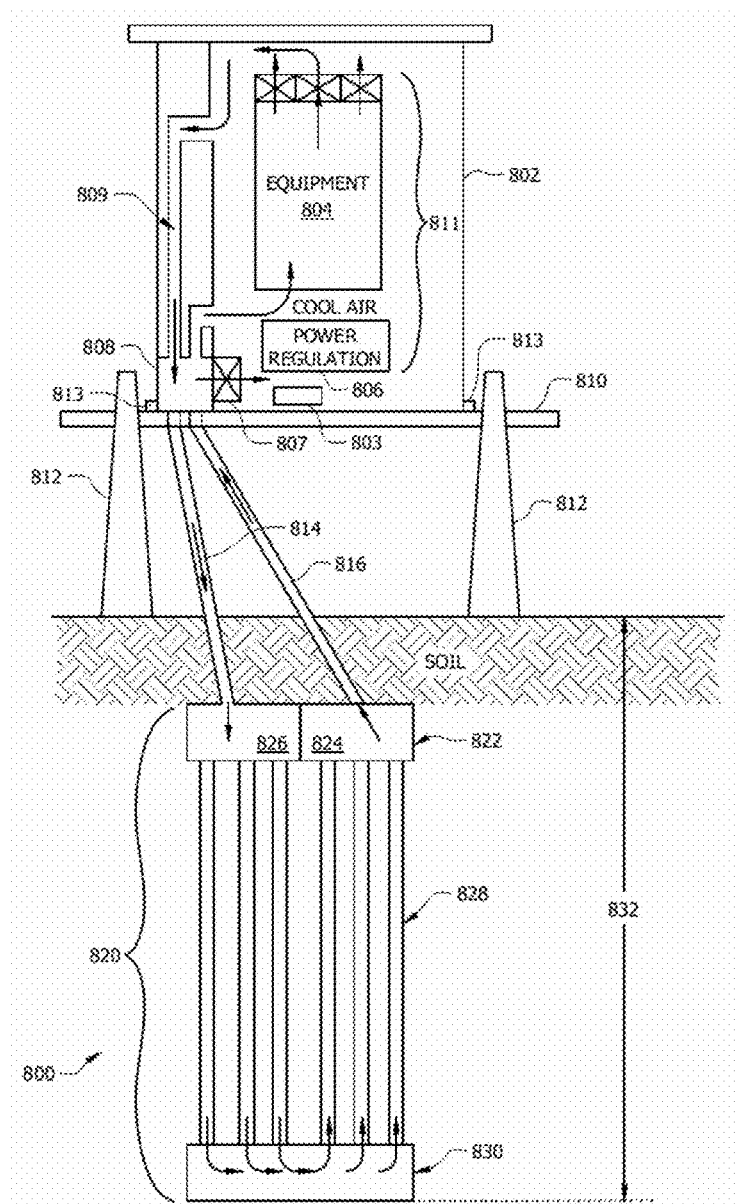
FIG. 8 shows a system with a raised telecom utility closure in use with an air-based geothermal system in accordance with an embodiment of the disclosure.

FIG. 8 shows a system 800 with a raised telecom utility closure 802 in use with an air-based geothermal system 820 in accordance with an embodiment of the disclosure. The configuration of an earth grounding component on the air-based geothermal system 820 is similar to FIG. 2A. For conciseness, the earth grounding component is not shown in FIG. 8. The raised telecom utility closure 802 is mounted, for example, to an overhead platform 810 supported by poles 812 that extend upward from the ground. With the overhead platform 810, the installation flexibility for the raised telecom utility closure 802 is increased compared to ground level or below ground installations. To facilitate mounting the raised telecom utility closure 802 to the overhead platform 810, the raised telecom utility closure 802 may include mounting interface components 813 (e.g., bolts, fasteners, threaded interfaces, etc).

In at least some embodiments, the raised telecom utility closure 802 houses equipment 804, power regulation and conversion components 806, or other components that generate heat. The hot air in raised telecom utility closure 802 is directed toward geothermal cooling air transferring device 808 at the base of the raised telecom utility closure 802. The geothermal cooling air transferring device 808 couples to a duct 814 that directs the airflow below ground, where air-based geothermal system 820 is installed.

As shown, the duct 814 directs airflow to a manifold inlet chamber side 826 of I/O manifold 822. From the manifold inlet chamber side 826, air circulates through some of the heat exchange tubes 828, which are spaced and are in contact with soil to enable transfer of heat from heated air circulating through the heat exchange tubes 828. At the base of the air-based geothermal system 820, a base manifold chamber 830 provides an airway between heat exchange tubes 828 carrying air downward towards the base of the air-based geothermal system 820 and other heat exchange tubes 828 carrying air upward towards manifold return chamber side 824 of the I/O manifold 822. In other words, the heat exchange tubes 828 are coupled between a divided I/O manifold 822 and an open base manifold chamber 830 to complete an air circulation loop for the air-based geothermal system 820. From the manifold return chamber side 824, airflow is directed via duct 816 to the raised telecom utility closure 802.

In accordance with at least some embodiments, the geothermal cooling air transferring device 808 controls a rate of air circulation through the air-based geothermal system 820. For example, the geothermal cooling air transferring device 808 may correspond to a fan, where the rotational speed of the fan is controllable (e.g., the fan may be in an "off" mode, a half-speed mode, a full-speed mode, or other speeds). The raised telecom utility closure 802 also comprises an internal circulating air transferring device 807 to facilitate airflow from a hot air channel 809 back to the heat load chamber 811, where equipment 804 and power regulation components 806 are located. In other words, the internal circulating air transferring device 807 causes hot air to circulate between the hot air channel 809 and the interior of the raised telecom utility closure 802.

The operation of the system 800, according to the embodiments of the disclosure, may be described in combination with a control strategy for the geothermal cooling air transferring device 808 and the internal circulating air transferring device 807. The control strategy can be carried out, for example, by a control module 803 in communication with temperature sensors (not shown), with the geothermal cooling air transferring device 808, and with the internal circulating air transferring device 807. In at least some embodiments, an environmental air temperature ($T_a$) and a reference temperature ($T_0$) are used as criterion for determining whether or not to activate the geothermal cooling air transferring device 808 and/or the internal circulating air transferring device 807. Further, an allowable equipment temperature ($T_e$) and a maximum equipment temperature ($T_{max}$) may be considered. If $T_a > T_0$, the control module 803 activates the geothermal cooling air transferring device 808 (e.g., full speed), while the internal circulating air transferring device 807 is de-activated. During the operation of the equipment 804, the control module 803 monitors and computes $T_e$ and $T_{max}$. If $T_e < T_{max}$, the control module 803 controls a rotational speed of the geothermal cooling air transferring device 808 according to a built-in rotational speed adjusting strategy. If $T_e > T_{max}$, the control module 803 may direct the geothermal cooling air transferring device 808 to run at full speed. If $T_a < T_0$ and $T_e < T_{max}$, the control module 803 may employ a natural cooling solution using internal air circulation within a telecom utility closure and thus using closure walls of the raised telecom utility closure 802 for heat exchange. This is used in conjunction with air flow from the air-based geothermal to add extra heating during extreme bouts of cold weather.

The natural cooling solution may be based on a heat insulation layer and/or a sun shielding cover at the top of raised telecom utility closure 802. Further, a wrinkled-wall structure for the raised telecom utility closure 802 may be adopted to increase the heat dissipating area and thus enhance the natural heat exchange ability of the raised telecom utility closure 802. By circulating air within the raised telecom utility closure 802, the natural heat exchange between the walls of the raised telecom utility closure 802 and the outside environment is improved.

Accordingly, during employment of the natural cooling solution, the control module 803 activates the internal circulating air transferring device 807 (e.g., at full speed), while the geothermal cooling air transferring device 808 is de-activated. If $T_e > T_{ma}$, (i.e., the natural cooling solution cannot maintain $T_e$ below $T_{max}$, the control module 803 may activate the air-based geothermal system 820 and the natural cooling solution together. If $T_e < T_{max}$, during employment of the natural cooling solution and the air-based geothermal system 820, the rotational speed of the geothermal cooling air transferring device 808 is adjusted according to the built-in rotational speed adjusting strategy. Otherwise, the control module 803 operates the geothermal cooling air transferring device 808 at full speed. To summarize, the control module 803 may selectively activate the air-based geothermal system 820, the natural cooling solution, or both based on monitoring and comparing $T_e$ with a predetermined $T_{max}$ value and/or based on monitoring and comparing $T_a$ with a predetermined $T_0$ value.

The control scheme employed for the system 800 also may be employed with ground-level telecom utility closures. Further, the selective operation of fans to control a rate of airflow circulation may be employed with any of the air-based geothermal systems described herein. In accordance with embodiments, such fans are controlled so that the power consumption to operate the air-based geothermal system is efficient. In other words, the fans would only operate as needed to maintain a desired temperature range within a telecom utility closure. In at least some embodiments, redundant fans are employed for each of the geothermal cooling air transferring device 808 and the internal circulating air transferring device 807. The default mode for redundant fans may be, for example, to operate together at approximately half speed or less. If one of the redundant fans fails, a remaining fan or fans operates at a higher speed.

Figure 9:
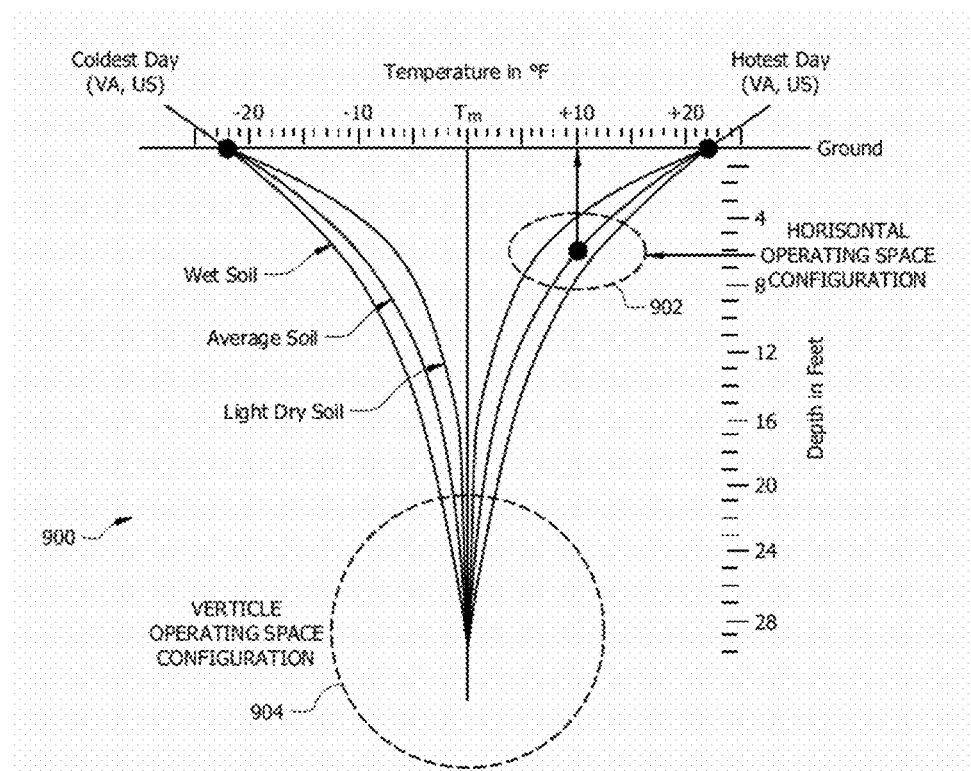
FIG. 9 shows an operating space chart for different air-based geothermal systems.

FIG. 9 shows an operating space chart 900 for different air-based geothermal systems. Chart 900 shows that on a hot day, the underground environment is up to 20° F. or so below the ground-level temperature, depending on the depth. Similarly, chart 900 shows that on a cold day, the underground environment is up to 20° F. above the ground-level temperature, depending on the depth. In other words, the underground environment can be employed to maintain a stable temperature and is most effective on hot days and cold days (compared to an average). The temperature underground also varies depending on the wetness of the soil as is shown in chart 900.

As is known, air temperature changes with seasons and time. During a hot season, such as summer, the need for reliable cooling increases due to the high temperature of the atmosphere. Implementing an air-based geothermal system as disclosed herein for temperature stabilization is particularly useful in a battery chamber, where batteries charge and discharge characteristics depend on the ambient temperature and where maintaining a stable temperature can significantly extend battery life.

As shown, the horizontal operating space 902 (referring to geothermal systems with horizontal heat exchange tube configurations) is between 4-8 feet underground, where the temperature is approximately 10° F. cooler than the ground level temperature on a hot day. Meanwhile, the vertical operating space 904 (referring to geothermal systems with vertical heat exchange tube configurations) is between 20-30 feet underground where the temperature is approximately 20° F. cooler than the ground level temperature on a hot day.

Figure 10:
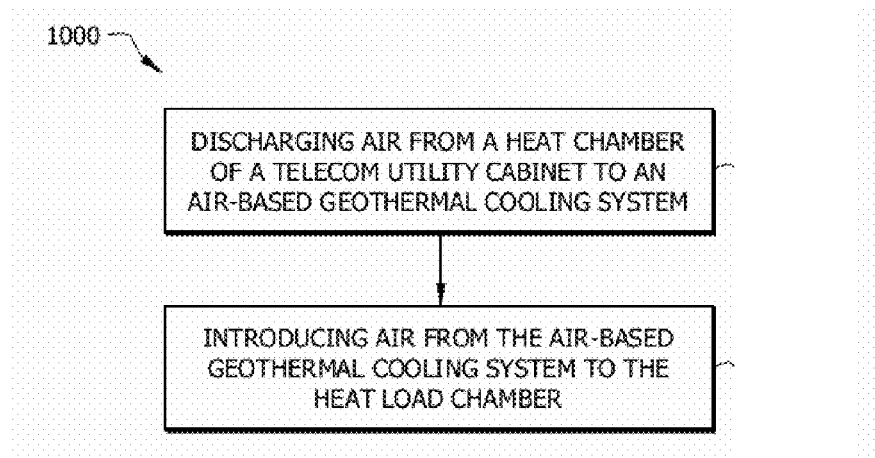
FIG. 10 shows a method for a telecom utility closure in accordance an embodiment of the disclosure.

FIG. 10 shows a method 1000 for a telecom utility closure in accordance with an embodiment of the disclosure. The method 1000 comprises discharging air from a heat load chamber of a telecom utility closure to an air-based geothermal system (block 1002). The method also comprises introducing air from the air-based geothermal system to the heat load chamber (block 1004). In at least some embodiments, discharging air and introducing air, as in blocks 1002 and 1004, occurs via a flexible air introducing duct and a flexible air discharging duct.

The method 1000 also may comprise additional steps, which may be implemented individually or together. For example, in at least some embodiments, the method 1000 may comprise passing air through a radiator after the discharging air step (block 1002) and before the introducing air step (block 1004). Additionally, the method 1000 may comprise selectively controlling a geothermal cooling air transferring device and an internal circulating air transferring device to adjust a rate of the discharging air step (block 1002) and the introducing air step (block 1004). Additionally, the method 1000 may comprise selectively operating a fan to adjust a rate of the discharging air step (block 1002) and the introducing air step (block 1004) based on comparison of an environmental air temperature measurement to a predetermined environmental air temperature threshold. Additionally, the method 1000 may comprise selectively operating a fan to adjust the rate of the discharging air step (block 1002) and the introducing air step (block 1004) based on comparison of an equipment air temperature measurement to a predetermined equipment air temperature threshold. If the equipment air temperature is determined to be greater than a predetermined threshold, the method 1000 may operate the fan at full speed. Additionally, the method 1000 may comprise operating redundant fans positioned below heat-producing electronics in a heat load chamber. In a default mode, the redundant fans may operate together at approximately half speed or less. Additionally, the method 1000 may comprise operating a plurality of redundant fans in an air discharging duct that conducts air from an air-based geothermal system to a heat load chamber of a telecom utility closure.

Figure 11:
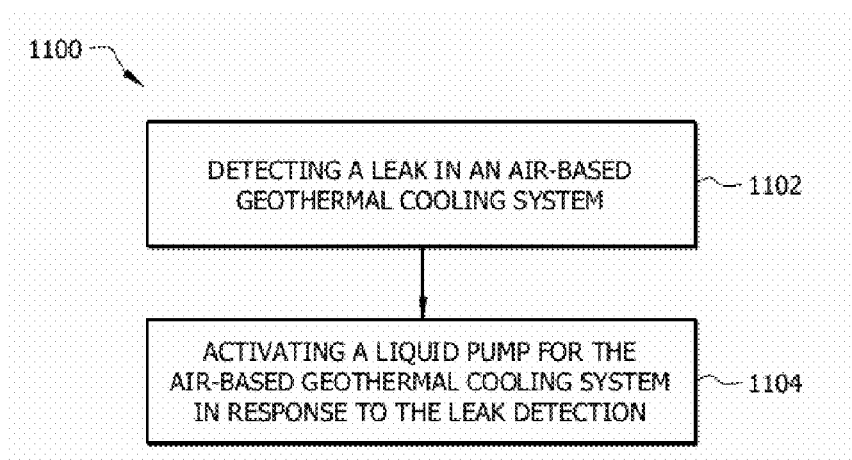
FIG. 11 shows a method for maintaining an air-based geothermal system in accordance with an embodiment of the disclosure.

FIG. 11 shows a method 1100 for maintaining an air-based geothermal system in accordance with an embodiment of the disclosure. The method 1100 comprises detecting a leak in an air-based geothermal system (block 1102). The method 1100 also comprises activating a liquid pump for the air-based geothermal system in response to the detected leak (block 1104). As an example, the leak detection step (block 1102) may comprise monitoring a leak detector positioned at a base of the air-based geothermal system. Additionally or alternatively, the leak detection step (block 1102) may comprise monitoring a leak detector positioned at a base of the air-based geothermal system via a leak detector maintenance tube separate from a plurality of heat exchange tubes corresponding to the air-based geothermal system. Additionally or alternatively, the leak detection step (block 1102) may comprise monitoring a leak detector positioned at a base of the air-based geothermal system via a return tube corresponding to the air-based geothermal system. Additionally or alternatively, the leak detection step (block 1102) may comprise monitoring a leak detector positioned in a base manifold chamber of the air-based geothermal system.

Meanwhile, the pump activation step (block 1104) may comprise activating a liquid pump for pumping liquid from a base of the air-based geothermal system. Additionally or alternatively, the pump activation step (block 1104) may comprise pumping liquid from a base of the air-based geothermal system via a pump access maintenance tube separate from a plurality of heat exchange tubes corresponding to the air-based geothermal system. Additionally or alternatively, the pump activation step (block 1104) may comprise pumping liquid via one of a plurality of heat exchange tubes corresponding to the air-based geothermal system. Additionally or alternatively, the pump activation step (block 1104) may comprise pumping liquid from a base manifold chamber of the air-based geothermal system.

Although the disclosed air-based geothermal systems are described for use with telecom utility closures, other electronic equipment that requires cooling would likewise benefit. Some of the benefits of the disclosed air-based geothermal systems (compared to traditional cooling systems) include, but are not limited to, a smaller installation footprint, a scalable design, a more reliable construction, lower cost (CAPEX and OPEX), lower power consumption, and lower acoustic noise levels.

Although embodiments may vary, at least some of the disclosed air-based geothermal systems provide up to 1500 Watts of cooling capacity for a telecom utility closure.

Further, at least some of the disclosed air-based geothermal systems provide a cooling coefficient of performance (COP) between 110 and 290. Further, at least some of the disclosed air-based geothermal systems operate with an acoustic noise level below 45 dBA. Further, at least some of the disclosed air-based geothermal systems have a surface area footprint of less than 5 square feet. Further, at least some of the disclosed air-based geothermal systems extend to a depth between 20 to 40 feet underground. Further, at least some of the disclosed air-based geothermal systems comprise fans for air circulation, where the fans are reliable at more than 150K hours at 60° C. and single fan failure is supported (i.e., fan redundancy is provided).

In accordance with embodiments, some or all of the components (e.g., the manifold, the heat exchange tubes, the leak detection maintenance tube, the pump access maintenance tube, etc.) of the disclosed air-based geothermal systems are constructed from high-density polyethylene (HDPE). The HDPE components are fused together and may have a wall thickness of up to 2 inches. The type of HDPE used may correspond to PE 3406/3608 per the ASTM D3350 specification. Although other materials may be used, HDPE benefits from an operational range of −110° C. to 130° C., crush resistance characteristics, chemical inertness (except for hydrocarbons), and reliability up to 50 years or more. Further, HDPE retains full strength when fused and does not need to be painted or finished (direct installation is possible). Further, the repair of an HDPE air-based geothermal system can be accomplished at the site using leave-in-place sleeves that melt to join two HDPE tubes. As an example, the preparation and joining of two 3 inch HDPE tubes may be done in 15 minutes or so. In at least some embodiments, the inlet duct 118 and return duct 120 may be constructed from stainless steel, instead of HDPE, and are bolted to the I/O manifold of an air-based geothermal system. Variations are possible to depending on the manufacturing process and/or the installation process.

The drilling of holes for the disclosed air-based geothermal systems is facilitated by available equipment. For example, a 40 foot hole with a diameter of 24 inches can be drilled in 30 minutes or so with available truck-mounted drilling rigs. Although various backfilling materials exist, at least some disclosed air-based geothermal systems may be installed without special backfilling mixtures (i.e., the soil itself is sufficient). Although vertical holes are intended for installation of most of the disclosed air-based geothermal systems, non-vertical hole arrangements are possible. Thus, in some embodiments, a slanted hole arrangement for installation of the disclosed vertical air-based geothermal systems air-based may be used. As an example, an inverted V shape arrangement for adjacent holes may be used such that the corresponding telecom utility closures are near each other, but their corresponding air-based geothermal systems extend away from each other underground. Without the inverted V shape hole arrangement, adjacent air-based geothermal systems would affect each other's cooling capacity to a greater extent. Such slanted hole arrangements may be made to avoid rock formations and/or to minimize spacing between telecom utility closures at the surface while still providing sufficient underground spacing between the respective air-based geothermal systems.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as comprises, includes, and having should be understood to provide support for narrower terms such as consisting of, consisting essentially of, and comprised substantially of. All documents described herein are incorporated herein by reference.

What is claimed is:

1. A geothermal system with earth grounding for providing electrical grounding, the geothermal system comprising:
   a geothermal component configured to perform heat exchange;
   wherein the geothermal component comprises at least one heat exchange tube configured to extend into an underground environment;
   an earth grounding component configured to provide earth grounding for electronic equipment; and
   wherein the earth grounding component includes at least one conductive rod coupled to and extended along the at least one heat exchange tube, and the at least one conductive rod is configured to electrically couple to a grounding interface of the electronic equipment;
   wherein the at least one conductive rod is mechanically or molecularly bonded to at least one clamp, and the at least one clamp holds around the at least one heat exchange tube;
   wherein the at least one clamp is placed at the bottom of the at least one conductive rod;
   wherein the at least one conductive rod extends into the underground environment at a depth equal to or greater than 10 feet;
   wherein the geothermal component further comprises:
   an input/output (I/O) manifold coupled to the at least one heat exchange tube;
   a flexible connect system coupled to the I/O manifold and configured to provide an airway between the I/O manifold and a utility cabinet;
   an air transferring device coupled to the I/O manifold and configured to circulate airflow between the utility cabinet, the I/O manifold, and the at least one heat exchange tube at an adjustable rate; and
   a temperature control device coupled to the air transferring device and configured to maintain a selectable operating temperature range for the utility cabinet by selectively adjusting a rotational speed of the air transferring device to control a rate of the airflow between the utility cabinet, the I/O manifold, and the at least one heat exchange tube according to the following criteria:
   deactivating the air transferring device automatically when Ta<T0 and Te<Tmax;

controlling the air transferring device automatically according to a rotational speed adjusting strategy when Ta>T0 and Te<Tmax; and
directing the air transferring device automatically to operate at a full speed when Ta>T0 and Te>Tmax,
wherein Ta is an external environmental air temperature measurement,
wherein T0 is a pre-determined external environmental air temperature threshold,
wherein Te is an internal utility cabinet air temperature measurement,
wherein Tmax is a pre-determined internal utility cabinet air temperature threshold,
wherein the I/O manifold comprises a manifold inlet chamber and a manifold return chamber separate from the manifold inlet chamber, and
wherein the manifold inlet chamber and the manifold return chamber are separated by a vertical plate that divides the I/O manifold into a manifold return chamber side and a manifold inlet chamber side.

2. The geothermal system of claim 1, wherein the at least one conductive rod is mechanically or molecularly bonded to the at least one clamp in a manner that the at least one conductive rod is spaced from the at least one heat exchange tube.

3. The geothermal system of claim 1, wherein the at least one clamp is conductive and is electrically coupled to the at least one conductive rod.

4. The geothermal system of claim 1, wherein the at least one clamp is a sleeve clamp or a strap clamp.

5. The geothermal system of claim 1, wherein the at least one clamp is made part of or all of a thermal insulated material.

6. The geothermal system of claim 1, wherein the at least one conductive rod comprises more than one conductive rods, and wherein the more than one conductive rods are electrically connected with each other.

7. The geothermal system of claim 1, wherein the at least one conductive rod extends along the at least one heat exchange tube in a parallel way or in a spiral way.

8. The geothermal system of claim 1, wherein a cross section of the at least one conductive rod has a shape of round, ellipse, rectangle, flat strip, hollow or diamond.

9. A geothermal system with earth grounding for providing electrical grounding, the geothermal system comprising:
a geothermal component configured to perform heat exchange;
wherein the geothermal component comprises at least one heat exchange tube configured to extend into an underground environment;
an earth grounding component configured to provide earth grounding for electronic equipment; and
wherein the earth grounding component includes at least one conductive rod coupled to and extended along the at least one heat exchange tube, and the at least one conductive rod is configured to electrically couple to a grounding interface of the electronic equipment;
wherein the at least one conductive rod is mechanically or molecularly bonded to at least one clamp, and the at least one clamp holds around the at least one heat exchange tube;
wherein the at least one clamp is placed at the bottom of the at least one conductive rod;
wherein the at least one conductive rod extends into the underground environment at a depth equal to or greater than 10 feet;
wherein the geothermal component further comprises:
an input/output (I/O) manifold coupled to the at least one heat exchange tube;
a flexible connect system coupled to the I/O manifold and configured to provide an airway between the I/O manifold and a utility cabinet; and
a temperature control device coupled to the I/O manifold and configured to maintain a selectable operating temperature range for the utility cabinet,
wherein the I/O manifold comprises a manifold inlet chamber and a manifold return chamber separate from the manifold inlet chamber,
wherein the manifold return chamber and the manifold inlet chamber are separated by a return tube that divides the I/O manifold such that an area outside the return tube comprises the manifold inlet chamber and an area inside the return tube comprises the manifold return chamber,
wherein the manifold return chamber comprises an adjustable airflow device coupled to the return tube and configured to draw airflow from the return tube to the utility cabinet at an adjustable rate, and
wherein the temperature control device is further configured to maintain the operating temperature range by selectively adjusting a rotational speed of the airflow device to control a rate of the airflow according to the following criteria:
deactivating the airflow device automatically when $T_a<T_0$ and $T_e<T_{max}$;
controlling the airflow device automatically according to a rotational speed adjusting strategy when $T_a>T_0$ and $T_e<T_{max}$, and
directing the airflow device automatically to operate at a full speed when $T_a>T_0$ and $T_e>T_{max}$,
wherein $T_a$ is an external environmental air temperature measurement,
wherein $T_0$ is a pre-determined external environmental air temperature threshold,
wherein $T_e$ is an internal utility cabinet air temperature measurement, and
wherein $T_{max}$ is a pre-determined internal utility cabinet air temperature threshold.

10. The geothermal system of claim 9, wherein the at least one conductive rod is mechanically or molecularly bonded to the at least one clamp in a manner that the at least one conductive rod is spaced from the at least one heat exchange tube.

11. The geothermal system of claim 9, wherein the at least one clamp is conductive and is electrically coupled to the at least one conductive rod.

12. The geothermal system of claim 9, wherein the at least one clamp is a sleeve clamp or a strap clamp.

13. The geothermal system of claim 9, wherein the at least one clamp is made part of or all of a thermal insulated material.

14. The geothermal system of claim 9, wherein the at least one conductive rod comprises more than one conductive rods, and wherein the more than one conductive rods are electrically connected with each other.

15. The geothermal system of claim 9, wherein the at least one conductive rod extends along the at least one heat exchange tube in a parallel way or in a spiral way.

16. The geothermal system of claim 9, wherein a cross section of the at least one conductive rod has a shape of round, ellipse, rectangle, flat strip, hollow or diamond.

* * * * *